(12) United States Patent
Kim et al.

(10) Patent No.: US 10,401,676 B2
(45) Date of Patent: Sep. 3, 2019

(54) METHOD OF MANUFACTURING A WIRE GRID POLARIZER FOR A DISPLAY APPARATUS

(71) Applicant: Samsung Display Co., Ltd., Yongin-si (KR)

(72) Inventors: Sungman Kim, Seoul (KR); Junho Song, Seongnam-si (KR); Hanjun Yu, Seoul (KR); Seon Uk Lee, Seongnam-si (KR); Seongsu Lim, Seoul (KR); Tae Hyung Hwang, Seoul (KR)

(73) Assignee: Samsung Display Co., Ltd., Youngin-si (KR)

( * ) Notice: Subject to any disclaimer, the term of this patent is extended or adjusted under 35 U.S.C. 154(b) by 0 days.

(21) Appl. No.: 15/723,645

(22) Filed: Oct. 3, 2017

(65) Prior Publication Data

US 2018/0101058 A1    Apr. 12, 2018

(30) Foreign Application Priority Data

Oct. 7, 2016 (KR) .......................... 10-2016-0130092

(51) Int. Cl.
*G02F 1/1335* (2006.01)
*G03F 7/00* (2006.01)
*G03F 7/16* (2006.01)

(52) U.S. Cl.
CPC .. *G02F 1/133528* (2013.01); *G02F 1/133536* (2013.01); *G03F 7/0002* (2013.01); *G03F 7/0007* (2013.01); *G03F 7/0035* (2013.01); *G03F 7/16* (2013.01); *G02F 2001/133548* (2013.01); *G02F 2001/133565* (2013.01)

(58) Field of Classification Search
CPC ......... G02F 1/133528; G02F 1/133536; G03F 7/0002; G03F 7/0007; G03F 7/0035; G03F 7/16
USPC ........................... 427/162–169, 163.1, 163.2
See application file for complete search history.

(56) References Cited

U.S. PATENT DOCUMENTS

| | | | |
|---|---|---|---|
| 6,288,840 | B1 | 9/2001 | Perkins et al. |
| 7,965,357 | B2 | 6/2011 | Van De Witte et al. |
| 8,525,958 | B2 | 9/2013 | Lee |

(Continued)

FOREIGN PATENT DOCUMENTS

| | | |
|---|---|---|
| KR | 10-1155200 | 6/2012 |
| KR | 10-2014-0117425 | 7/2014 |

*Primary Examiner* — Elizabeth A Burkhart
(74) *Attorney, Agent, or Firm* — H.C. Park & Associates, PLC

(57) ABSTRACT

A method of manufacturing a wire grid polarizer for a display apparatus includes the steps of forming a first layer on a base substrate including an active area and a peripheral area surrounding the active area, forming a hard mask layer on the first layer, coating an imprint resin on the hard mask layer, forming an imprint resin pattern by imprinting a stamp on the imprint resin, wherein the stamp is larger than the base substrate, forming a hard mask pattern by patterning the hard mask layer using the imprint resin pattern, forming a wire grid pattern layer by pattering the first layer using the hard mask pattern, forming a photoresist pattern in the active area on the base substrate, removing the hard mask pattern and the wire grid pattern layer in the peripheral area using the photoresist pattern, and forming a capping layer on the wire grid pattern.

20 Claims, 36 Drawing Sheets

(56) References Cited

U.S. PATENT DOCUMENTS

| | | | | |
|---|---|---|---|---|
| 2011/0042352 | A1* | 2/2011 | Okushima | B29C 33/424 |
| | | | | 216/44 |
| 2013/0153534 | A1* | 6/2013 | Resnick | B29D 11/0074 |
| | | | | 216/24 |
| 2013/0270223 | A1* | 10/2013 | Lee | G03F 7/031 |
| | | | | 216/24 |
| 2016/0047961 | A1* | 2/2016 | Park | G02B 5/3058 |
| | | | | 359/485.05 |
| 2016/0116798 | A1* | 4/2016 | Nam | G02F 1/133528 |
| | | | | 349/42 |
| 2016/0161654 | A1* | 6/2016 | Yeo | G02B 5/3058 |
| | | | | 359/485.05 |

\* cited by examiner

AA'

METHOD OF MANUFACTURING A WIRE GRID POLARIZER FOR A DISPLAY APPARATUS

CROSS-REFERENCE TO RELATED APPLICATION

This application claims priority from and the benefit of Korean Patent Application No. 10-2016-0130092, filed on Oct. 7, 2016, which is hereby incorporated by reference for all purposes as if fully set forth herein.

BACKGROUND

Field

The invention relates generally to a method of manufacturing a display apparatus, and more particularly, to a method of manufacturing a wire grid polarizer for a display apparatus.

Discussion of the Background

Recently, a display apparatus having light weight and small size has been manufactured. A cathode ray tube (CRT) display apparatus has been used due to performance and competitive price. However the size or portability of CRT display apparatus is disadvantageous. Therefore, the small size, light weight and low-power-consumption of a display apparatus such as a plasma display apparatus, a liquid crystal display apparatus and an organic light emitting display apparatus has been highly regarded.

The liquid crystal display apparatus applies a voltage to specific molecular arrangement configured to change the molecular arrangement. The liquid crystal display apparatus displays an image using changes of optical property (for example, birefringence, rotatory polarization, dichroism and light scattering) of a liquid crystal cell according to the changes of the molecular arrangement.

The liquid crystal display apparatus may include an internally formed wire grid polarizer (IN-CELL), and the quality of the wire grid polarizer may affect display quality. Accordingly, there is a need for a manufacturing process for improving the quality of the wire grid polarizer.

The above information disclosed in this Background section is only for enhancement of understanding of the background of the inventive concepts, and, therefore, it may contain information that does not constitute prior art.

SUMMARY

Applicants have discovered that during the process of separating an imprinting stamp from a substrate used to form a wire grid polarizer, damage may be caused to an imprint resin pattern formed by the stamp due to bonding of the imprint resin to an edge portion of an imprinting stamp. Methods of manufacturing a wire grid polarizer for a display apparatus according to the principles of the invention have improved quality and are capable of improving display quality. For example, exemplary methods according to the principles of the invention facilitate separation of the imprinting stamp from the base substrate (de-molding) without causing damage to the edge regions of the imprint resin pattern.

Additional aspects will be set forth in the detailed description which follows, and, in part, will be apparent from the disclosure, or may be learned by practice of the inventive concepts.

According to one aspect of the invention, an exemplary method of manufacturing a wire grid polarizer for a display apparatus includes the steps of forming a first layer on a base substrate including an active area and a peripheral area surrounding the active area, forming a hard mask layer on the first layer, coating an imprint resin on the hard mask layer, forming an imprint resin pattern by imprinting a stamp on the imprint resin, wherein the stamp is larger than the base substrate, forming a hard mask pattern by patterning the hard mask layer using the imprint resin pattern, forming a wire grid pattern layer by pattering the first layer using the hard mask pattern, forming a photoresist pattern in the active area on the base substrate, removing the hard mask pattern and the wire grid pattern layer in the peripheral area using the photoresist pattern, and forming a capping layer on the wire grid pattern.

The step of coating the imprint resin may include forming an adhesion promoter layer on the hard mask layer, and coating the imprint resin on the adhesion promoter layer.

The method may further include forming a photoresist layer on the first layer before forming the hard mask layer, removing outer boundary portion of the photoresist layer, and removing outer boundary portion of the first layer using the photoresist layer in which the outer boundary portion is removed.

The step of forming the first layer may include forming the first layer from at least one of the aluminum (Al), titanium (Ti), gold (Au), chromium (Cr), silver (Ag), copper (Cu), nickel (Ni), iron (Fe) and cobalt (Co). The step of forming the hard mask layer may include forming the hard mask layer from a silicon compound.

The step of forming the wire grid pattern layer may include forming a plurality of protrusions having substantially the same shape at substantial uniform intervals at a pitch of about 50 nm to 150 nm.

According to another aspect of the invention, an exemplary method of manufacturing a wire grid polarizer for a display apparatus includes the steps of forming a first layer on a base substrate including an active area and a peripheral area surrounding the active area, forming a hard mask layer on the first layer, coating an imprint resin on the hard mask layer, forming an imprint resin pattern in a first area by imprinting a stamp on the imprint resin, wherein the stamp is smaller than the base substrate, wherein the first area is bigger than the active area, forming a hard mask pattern by patterning the hard mask layer using the imprint resin pattern, forming a wire grid pattern layer by pattering the first layer using the hard mask pattern, forming a photoresist pattern in an active area on the base substrate on which the wire grid pattern is formed, removing the hard mask pattern and the wire grid pattern layer in the peripheral area using the photoresist pattern, and forming a capping layer on the wire grid pattern.

The step of coating the imprint resin may include forming an adhesion promoter layer on the hard mask layer, and coating the imprint resin on the adhesion promoter layer.

The method may further include forming a photoresist layer on the first layer before forming the hard mask layer, removing outer boundary portion of the photoresist layer, and removing outer boundary portion of the first layer using the photoresist layer in which the outer boundary portion is removed.

The step of forming the first layer may include forming the first layer from at least one of the aluminum (Al), titanium (Ti), gold (Au), chromium (Cr), silver (Ag), copper (Cu), nickel (Ni), iron (Fe) and cobalt (Co). The step of forming the hard mask layer may include forming the hard mask layer from a silicon compound.

The step of forming the wire grid pattern layer may include forming a plurality of protrusions having substantially the same shape at substantially uniform intervals at a pitch of about 50 nm to 150 nm.

According to yet another aspect of the invention, an exemplary method of manufacturing a wire grid polarizer for a display apparatus includes the steps of forming a first layer on a base substrate including an active area and a peripheral area surrounding the active area, forming a hard mask layer on the first layer, coating an imprint resin on the hard mask layer, forming an imprint resin pattern in a first area by imprinting a stamp on the imprint resin, wherein the stamp is smaller than the base substrate, wherein the first area is bigger than the active area, forming a hard mask pattern by patterning the hard mask layer using the imprint resin pattern, forming a first photoresist pattern in an active area on the base substrate on which the hard mask pattern is formed, removing the hard mask pattern and the first layer in the peripheral area using the photoresist pattern, and forming a wire grid pattern layer by patterning the first layer using the hard mask pattern, and forming a capping layer on the wire grid pattern.

The step of coating the imprint resin may include forming an adhesion promoter layer on the hard mask layer, and coating the imprint resin on the adhesion promoter layer.

The method may further include forming a second photoresist layer on the first layer before forming the hard mask layer, removing an outer boundary portion of the second photoresist layer, and removing an outer boundary portion of the first layer using the second photoresist layer in which the outer boundary portion is removed.

The step of forming the second photoresist layer may include forming a positive type photoresist layer. In the step of removing the outer boundary portion of the second photoresist layer, the outer boundary portion of the second photoresist layer may be exposed and developed to be removed without an additional mask, or the outer boundary portion may be exposed and developed using an additional mask to be removed.

In the step of forming the first photoresist pattern, a pattern for forming an alignment key may be formed in the peripheral area. In the step of removing the hard mask pattern and the first layer in the peripheral area, the alignment key may be formed by patterning of the first layer and the hard mask pattern in the peripheral area.

In the step of coating the imprint resin, a substantially flat top surface of the hard mask layer in which there may be no stepped portion is larger than the first area.

The step of forming the first layer may include forming the first layer from at least one of the aluminum (Al), titanium (Ti), gold (Au), chromium (Cr), silver (Ag), copper (Cu), nickel (Ni), iron (Fe) and cobalt (Co). The step of forming hard mask layer may include forming the hard mask layer from a silicon compound.

The step of forming the wire grid pattern layer may include forming a plurality of protrusions having substantially the same shape at substantially uniform intervals at a pitch of about 50 nm to 150 nm.

The active area may be larger than a display area configured to display an image.

In exemplary methods of the invention, the top surface of the imprint resin pattern may be substantially flat and the adhesive promoter layer firmly bonds the imprint resin to the hard mask layer. Thus, when the stamp is separated from the base substrate (de-molding), there is less concern for damage to the imprint resin pattern caused by bonding of the imprint resin to edge portion of the stamp.

In addition, through subsequent process of exemplary methods of the invention, a pattern defect at the edge of the imprint resin pattern is removed by using the photoresist pattern, so that quality of the wire grid pattern of the active region in the region where the image is displayed is improved. Therefore, optical characteristics of wire grid polarizer may be improved. Accordingly, the display quality of the display device can be improved.

Additional features of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concepts, and are incorporated in and constitute a part of this specification, illustrate embodiments of the invention, and together with the description serve to explain principles of the invention.

DETAILED DESCRIPTION OF THE ILLUSTRATED EMBODIMENTS

Figure 1A:
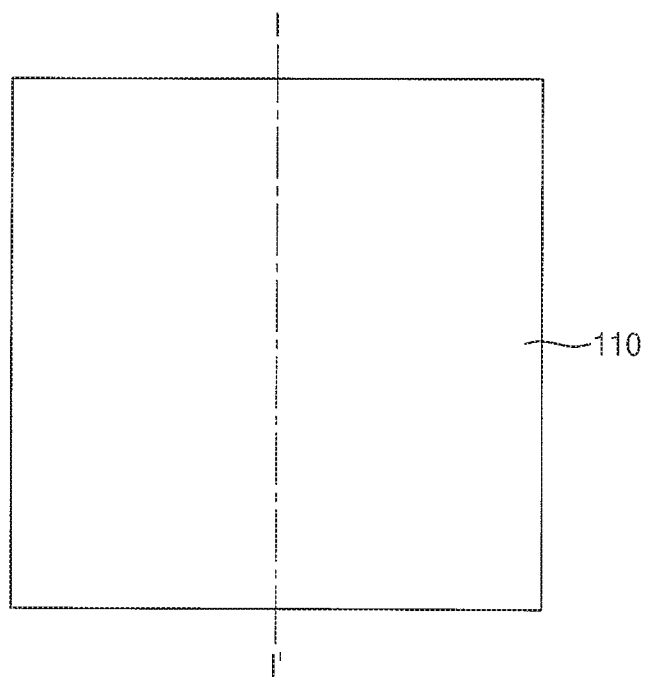
FIGS. 1A to 1P are plan views and cross-sectional views of steps in a first exemplary method of manufacturing a wire grid polarizer for a display apparatus according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the inventive concepts will be explained in detail with reference to the accompanying drawings.

Figure 1B:
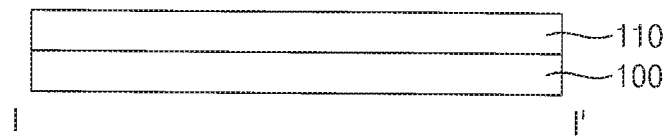
Figure 1C:
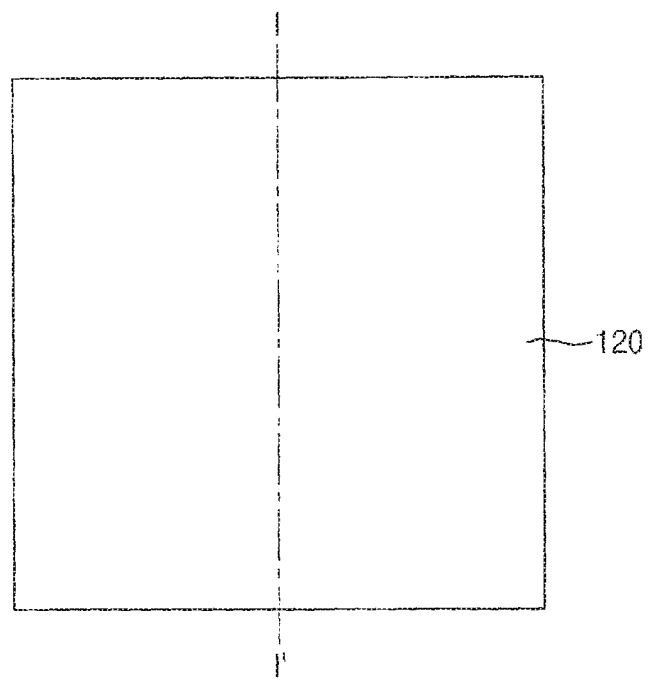
Figure 1D:
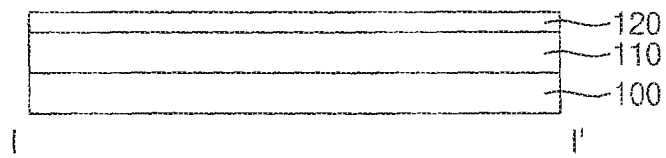
Figure 1E:
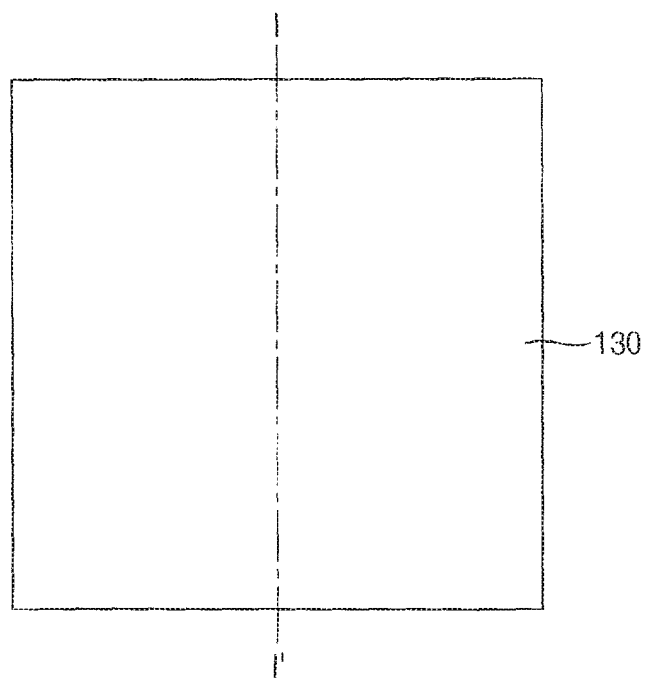
Figure 1F:
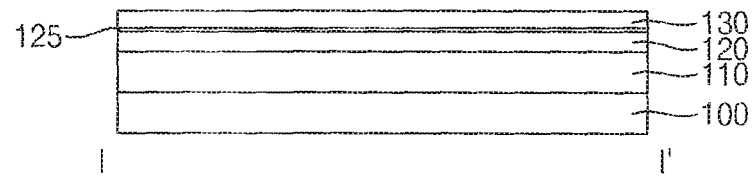
Figure 1G:
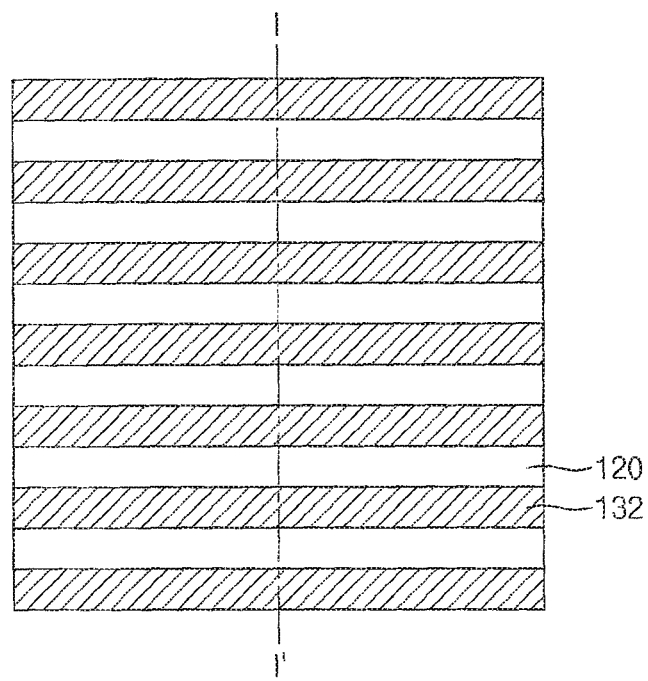
Figure 1H:
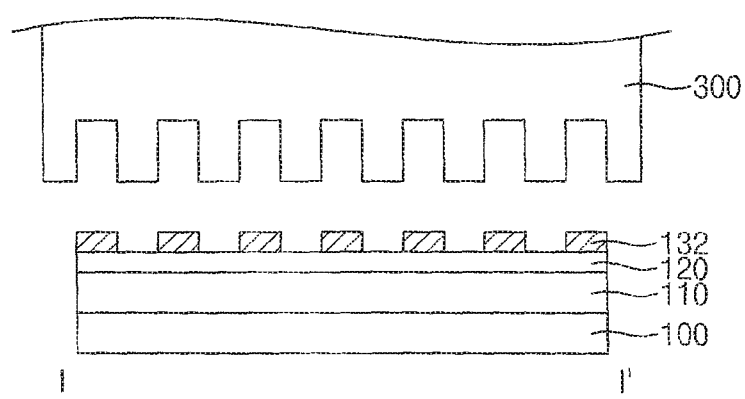
Figure 1I:
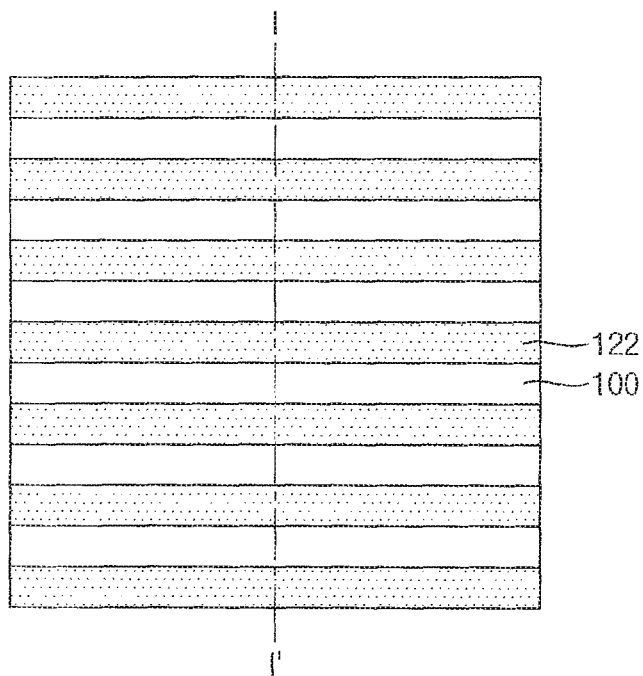
Figure 1J:
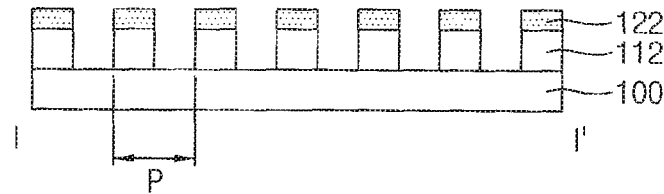
Figure 1K:
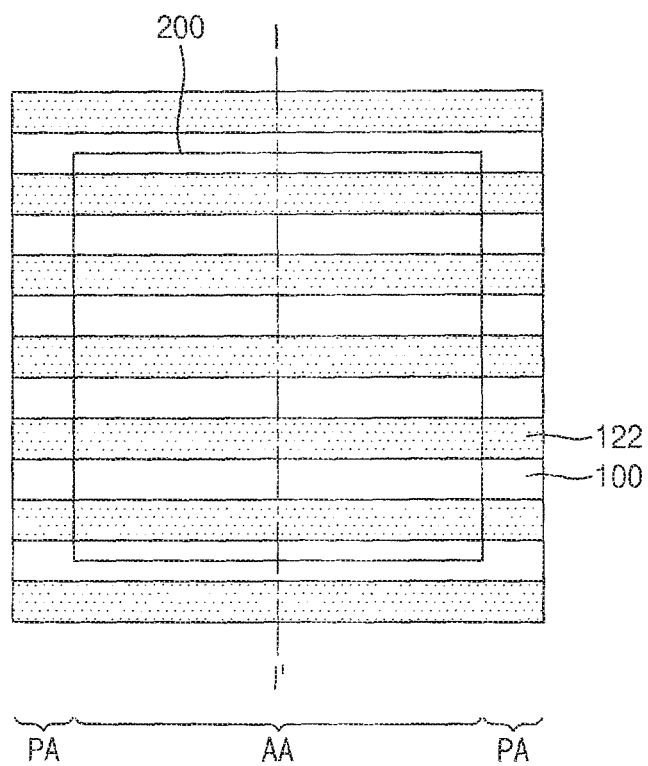
Figure 1L:
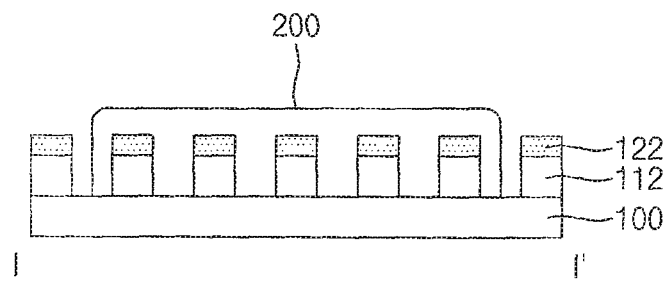
Figure 1M:
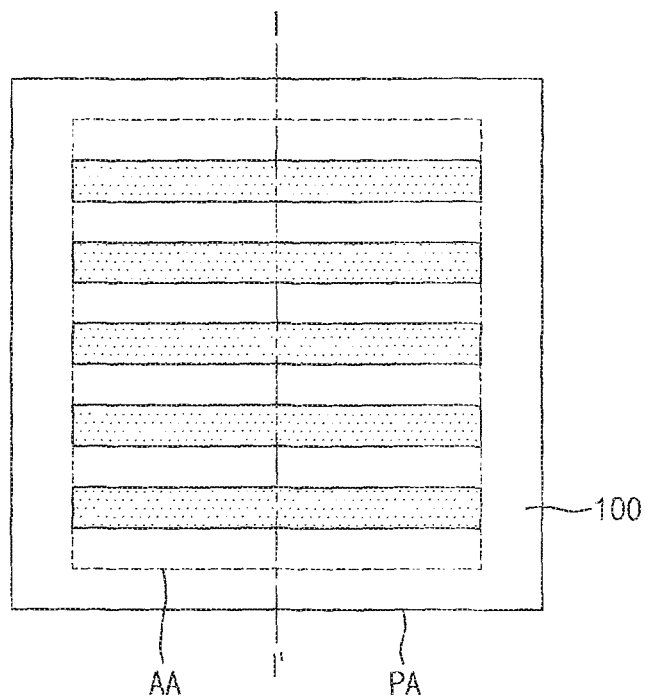
Figure 1N:
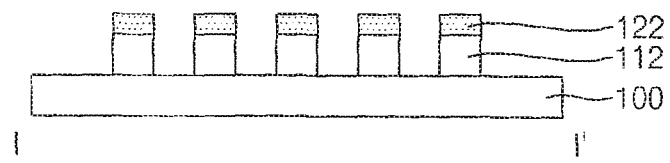
Figure 10:
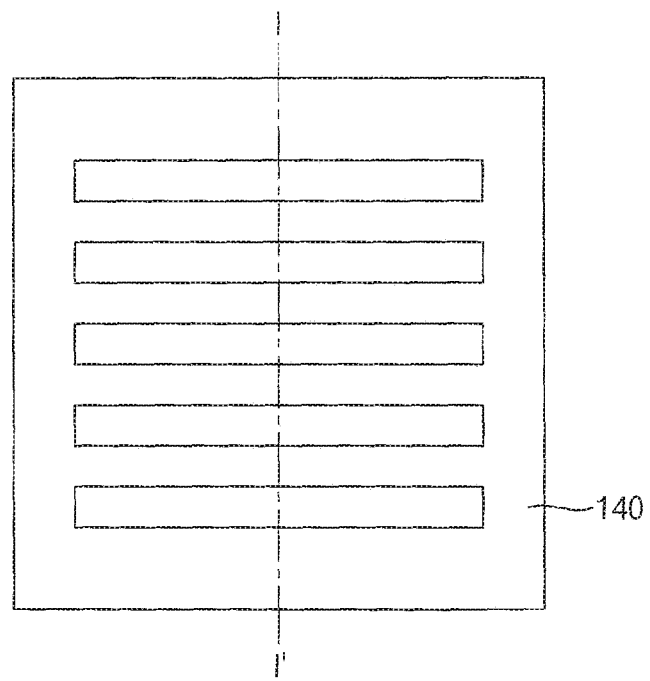
Figure 1P:
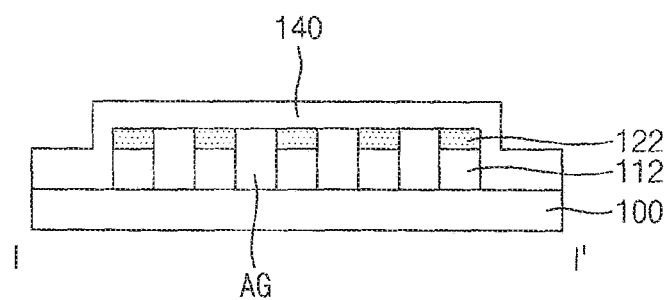

FIGS. 1A to 1P are plan views and cross-sectional views of steps in a first exemplary method of manufacturing a wire grid polarizer for a display apparatus according to the principles of the invention.

Referring to FIGS. 1A and 1B, a first layer 110 may be formed on a base substrate 100. The base substrate 100 may include a material having excellent light transmittance, heat resistance, and chemical resistance. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The first layer 110 may include metal. For example, the first layer 110 may include aluminum (Al), titanium (Ti), gold (Au), chromium (Cr), silver (Ag), copper (Cu), nickel (Ni), iron (Fe), cobalt (Co). These may be used alone or in combination with each other.

Referring to FIGS. 1C to 1D, a hard mask layer 120 may be formed on the first layer 110. The hard mask layer 120 may be formed using a conductive metal material or a nonconductive material. For example, the hard mask layer 120 may include an inorganic insulation layer such as silicon compound, etc. For example, the hard mask layer 120 may include silicon oxide (SiOx). Here, the hard mask layer 120 may have a thickness of about 900 ∪.

Referring to FIGS. 1E and 1F, an imprint resin 130 may be coated on the hard mask layer 120. The imprint resin 130 is for an imprint lithography process, and may be coated on all or substantially all of the top surface of the hard mask layer 120. Thus, the imprint resin 130 may be formed in an area corresponding to the entirety of the base substrate 100, so that the top surface of the imprint resin 130 may be substantially flat without any stepped portions formed thereon.

Here, before coating the imprint resin 130, an adhesion promoter layer 125 may be further formed on the hard mask layer 120. Thus, the adhesion promoter layer 125 may be further formed between the hard mask layer 120 and the imprint resin 130. The adhesion promoter layer 125 may allow the imprint resin 130 to firmly adhere to the hard mask layer 120.

Referring to FIGS. 1G, 1H, a stamp 300 may be imprinted on the imprint resin 130 to form an imprint resin pattern 132. In a plan view, the stamp 300 may be larger than the base substrate 100. Accordingly, when the stamp 300 is separated from the base substrate 100 (de-molding), there is less concern for damage to the imprint resin pattern 132 caused by bonding of the imprint resin 130 to edge portion of the stamp 300.

In addition, the imprint resin 130 is firmly bonded to the hard mask layer 120 by the adhesion promoter layer 125, so that when the stamp 300 is separated from the imprint resin 130 (de-molding), the imprint resin 130, there is less concern for damage to the imprint resin pattern 132 caused by bonding of imprint resin 130. In addition, the top surface of the imprint resin 130 is substantially flat without any stepped portions, so that the imprint resin pattern 132 may be uniformly formed.

Referring to FIGS. 1I and 1J, a hard mask pattern 122 may be formed by patterning the hard mask layer 120 using the imprint resin pattern 132. The hard mask pattern 122 may have a pitch P of about 50 nm (nanometer) to 150 nm corresponding to a wire grid pattern. The pitch P refers to the sum of the width of a fine line of the hard mask pattern and the distance between adjacent fine lines.

A wire grid pattern layer 112 may be formed by patterning the first layer 110 using the hard mask pattern 122. The wire grid pattern layer 112 may include a plurality of protrusions formed at substantially uniform intervals and having substantially the same shape.

Here, the hard mask pattern 122 and the wire grid pattern layer 112 may be formed by a separate process or by a continuous one process depending on a material of the hard mask layer 120 and the material of the first layer 110.

Referring to FIGS. 1K and 1L, the base substrate 110 may include an active area AA and a peripheral area PA surrounding the active area AA. The active area AA may correspond to an area where the wire grid polarizer is formed in the display apparatus, and the peripheral area PA may correspond to a peripheral area of the active area AA which is a non-display area. The active area AA may correspond to the display area in which image is displayed, and may be larger than or equal to the display area.

A photoresist pattern 200 may be formed in the active area AA on the base substrate 110 on which the wire grid pattern layer 112 is formed. The photoresist pattern 200 may be formed by coating a photoresist on the base substrate 110 on which the wire grid pattern layer 112 is formed and by exposure and development process of the photoresist using an additional mask as is known in the art.

Referring to FIGS. 1M and 1N, the hard mask pattern 112 and the wire grid pattern 122 in the peripheral area PA may be removed using the photoresist pattern 200. Accordingly, the wire grid pattern 112 only remains in the active area AA.

And then, the photoresist pattern 200 may be removed.

Referring to FIGS. 1O and 1P, a capping layer 140 may be formed on the base substrate 110 on which the wire grid pattern 112 is formed. The capping layer 140 may include silicon compound, and may be formed by a chemical vapor deposition CVD process, etc. Accordingly, air gap AG may be formed between the protrusions of the wire grid pattern 112.

Although not shown in the figures, the method may further include forming the other elements of the display apparatus such as a thin film transistor, a pixel electrode, and etc. These other elements may be of conventional, known design, and may have various structures as needed, and also may be formed through various known processes. Accordingly, the display apparatus with a wire grid polarizer formed by the inventive processes disclosed herein may be provided.

According to the illustrated embodiment, the top surface of the imprint resin 130 is substantially flat without any stepped portion, and the adhesive promoter layer 125 firmly bonds the imprint resin 130 to the hard mask layer 120, so that there is less concern for damage to the imprint resin pattern 132 caused by bonding of the imprint resin 130 to edge portion of the stamp 300 when the stamp 300 is separated from the imprint resin 130 (de-molding).

On the other hand, unlike the illustrated embodiment, when a stepped portion is formed on the top surface of the imprinted resin, the stamp may be damaged by the stepped portion during the imprinting process, and the imprinted resin pattern may be damaged around the stepped portion. In addition, there is a concern that the imprint resin pattern may be damaged around the stepped portion However, according to the illustrated embodiment, since the stamp 300 is imprinted an area larger than the size of the base substrate 110, a pattern defect at the edge of the imprint resin pattern 132 is unlikely to occur.

In addition, through subsequent process, patterns of the edge are patterned and removed by using the photoresist pattern 200, so that quality of the wire grid pattern of the active region in the region where the image is displayed is improved. Therefore, optical characteristics of wire grid polarizer may be improved. Accordingly, the display quality of the display device can be improved.

Figure 2A:
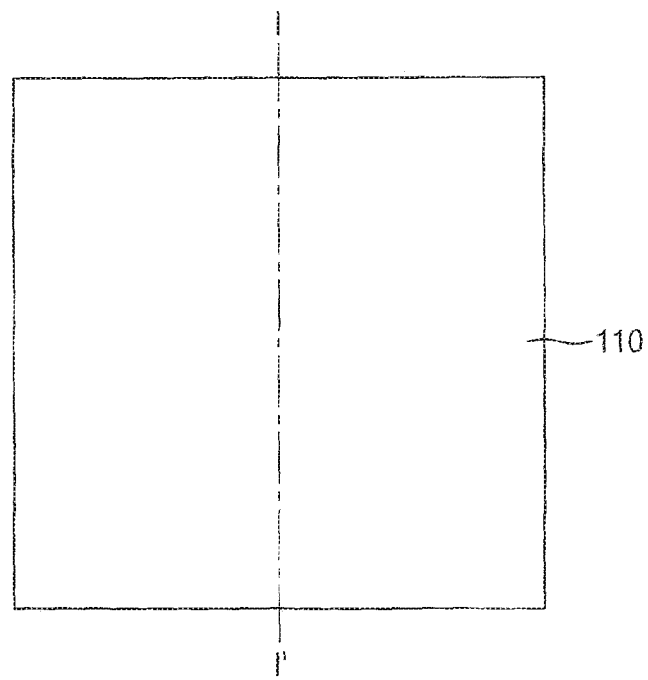
FIGS. 2A to 2P are plan views and cross-sectional views of steps in a second exemplary method of manufacturing a wire grid polarizer for a display apparatus according to the principles of the invention.
Figure 2B:
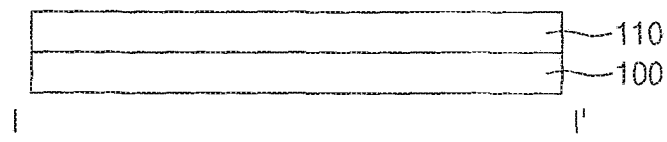
Figure 2C:
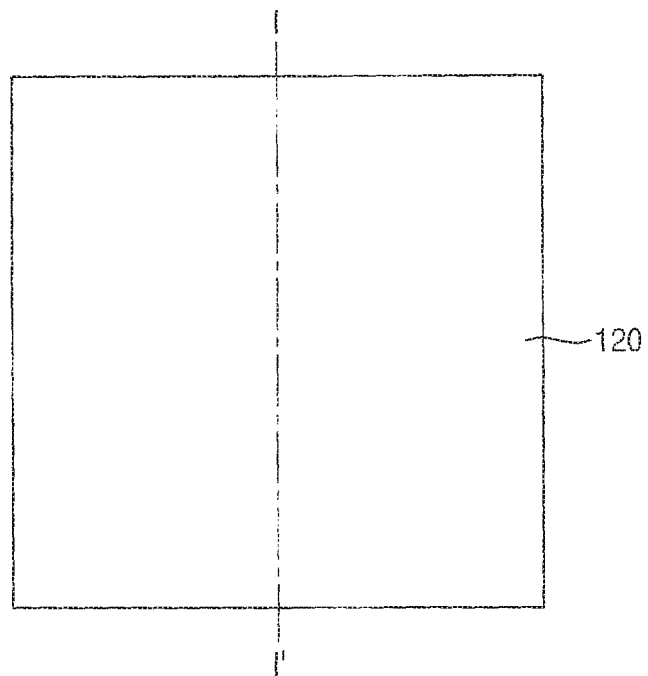
Figure 2D:
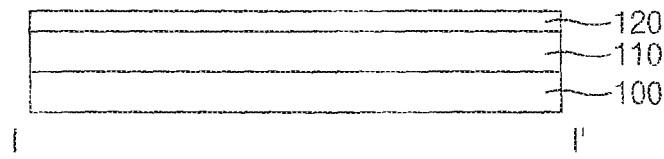
Figure 2E:
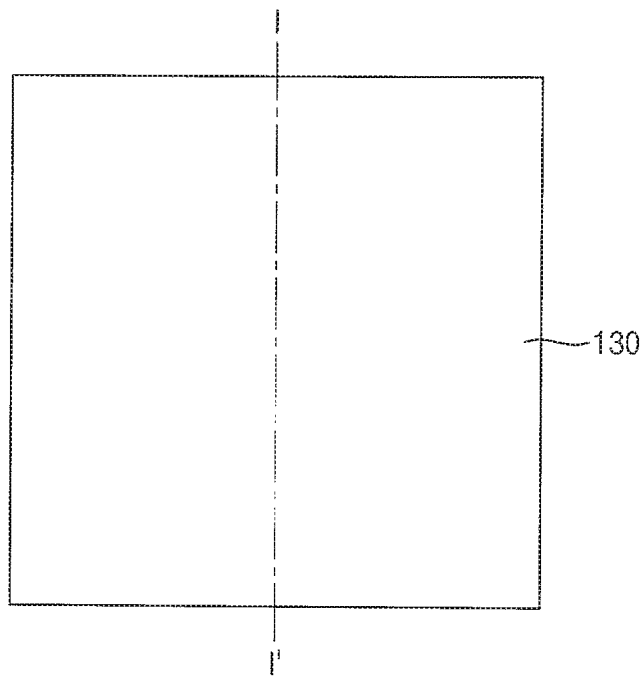
Figure 2F:
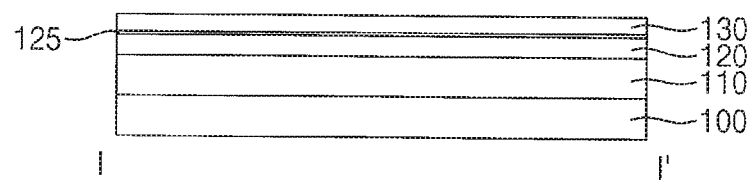
Figure 2G:
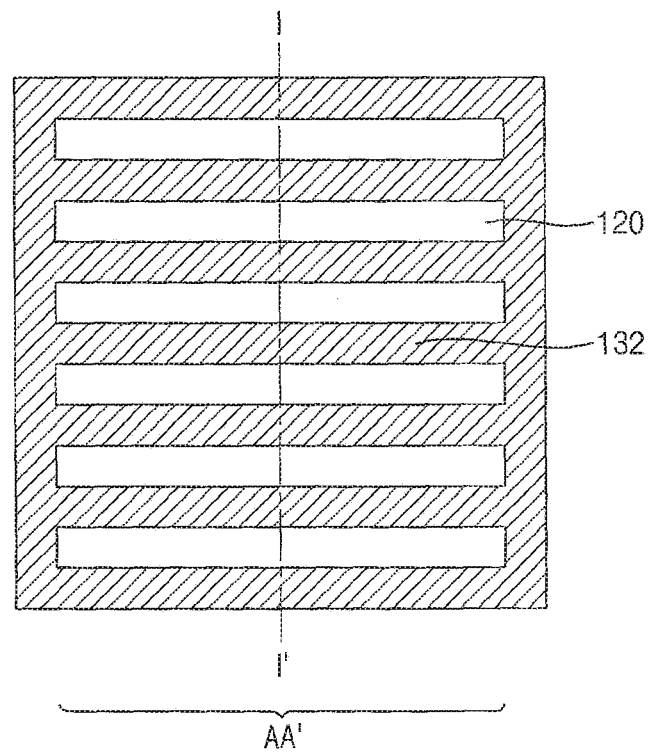
Figure 2H:
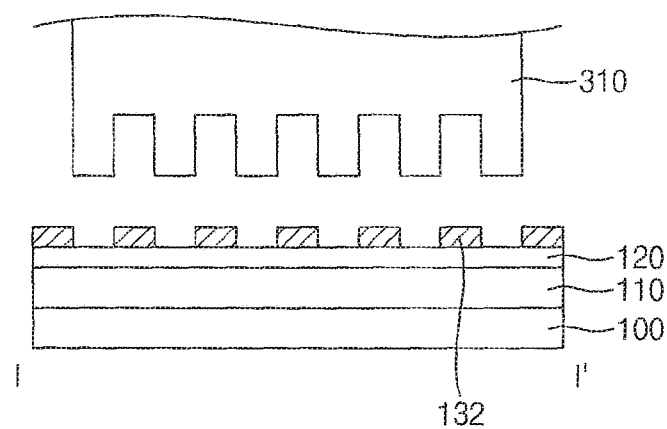
Figure 2I:
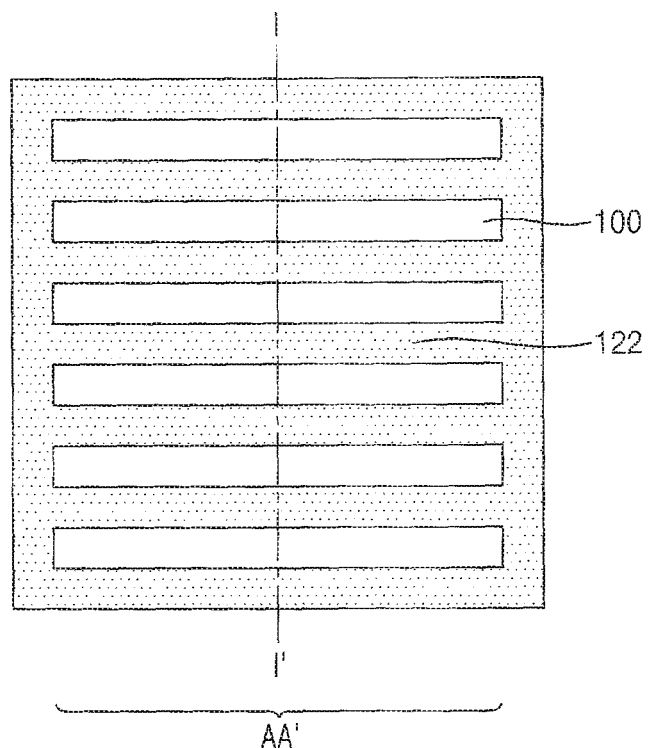
Figure 2J:
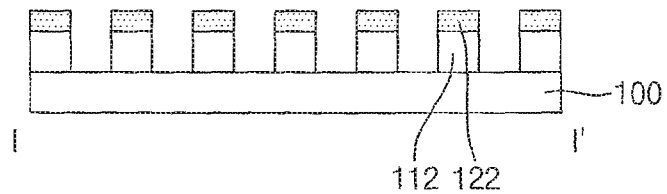
Figure 2K:
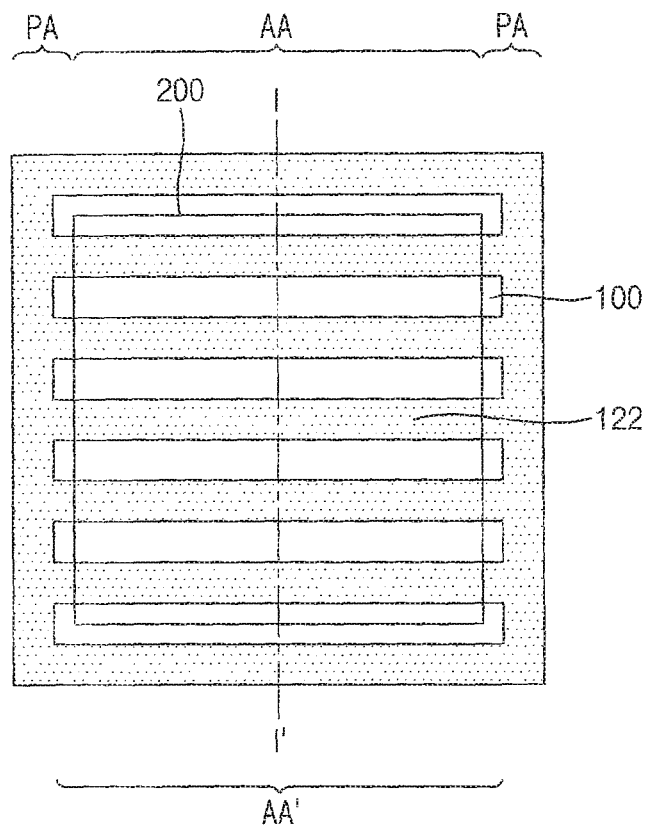
Figure 2L:
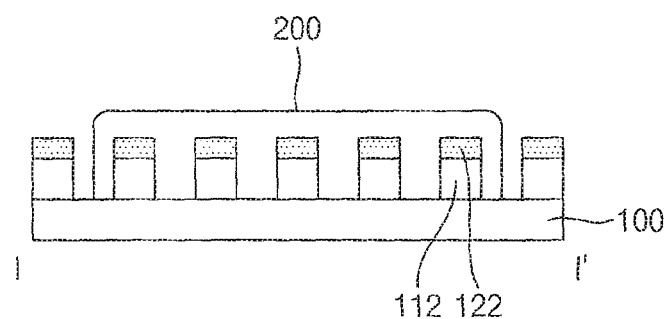
Figure 2M:
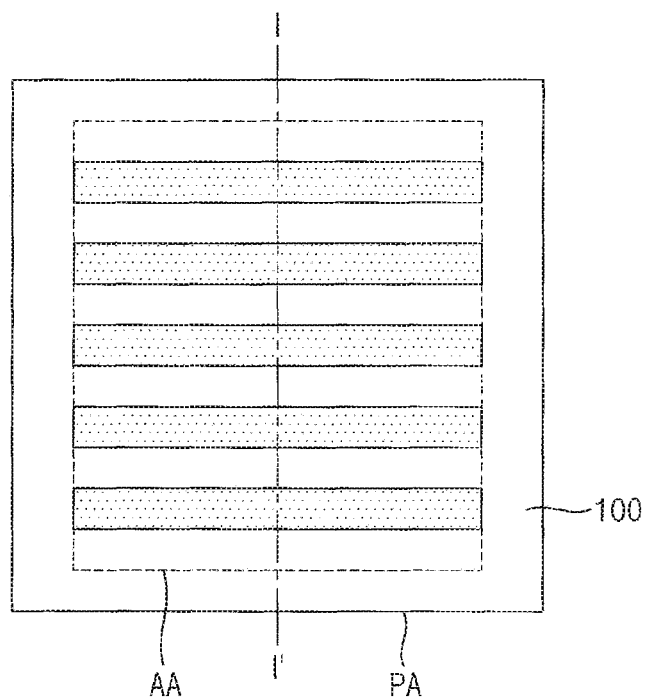
Figure 2N:
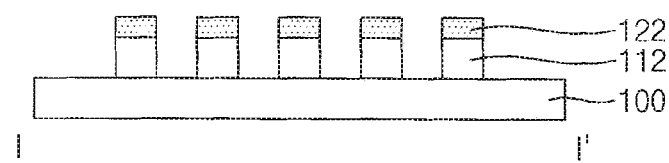
Figure 2O:
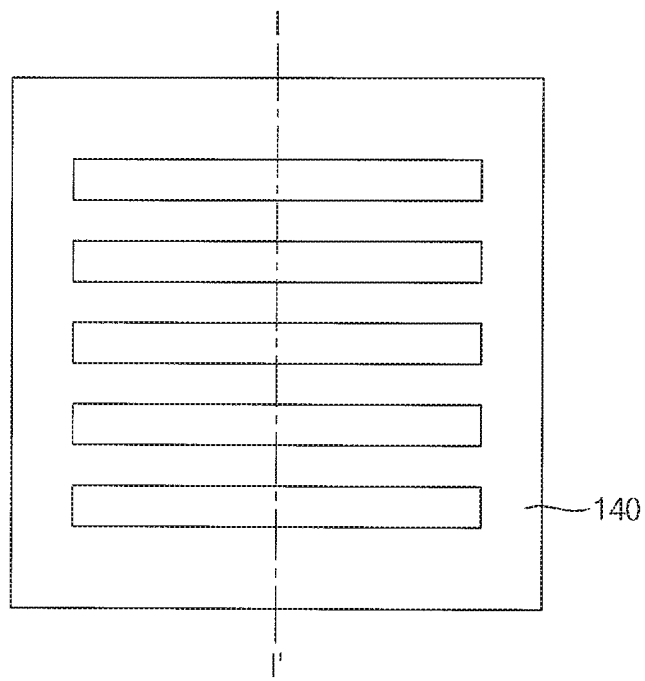
Figure 2P:
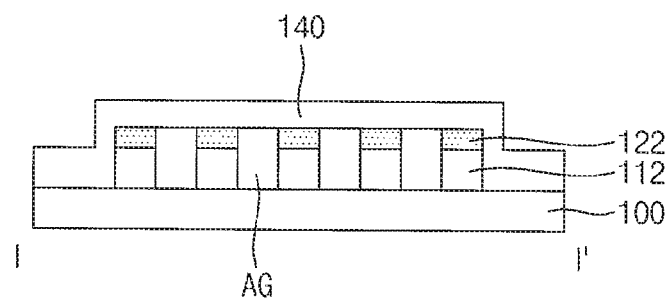

FIGS. 2A to 2P are plan views and cross-sectional views of steps in a second exemplary method of manufacturing a wire grid polarizer for a display apparatus according to the principles of the invention.

Referring to FIGS. 2A and 2B, a first layer 110 may be formed on a base substrate 100. This step is substantially the same as that of FIGS. 1A and 1B. Thus, redundant description is omitted.

Referring to FIGS. 2C and 2D, a hard mask layer 130 may be formed on the first layer 110. This step is substantially the same as that of FIGS. 1C and 1D. Thus, redundant description is omitted.

Referring to FIGS. 2E and 2F, an imprint resin 130 may be coated on the hard mask layer 120. Here, before coating the imprint resin 130, an adhesion promoter layer 125 may be further formed on the hard mask layer 120. These steps are substantially the same as that of FIGS. 1E and 1F. Thus, redundant description is omitted.

Referring to FIGS. 2G and 2H, an imprint resin pattern 132 may be formed on the base substrate 110 in a first area AA'. An imprint resin pattern 132 may be formed by imprinting a stamp 310 having the same size as the first area AA' on the imprint resin 130.

Referring to FIGS. 2I and 2J, a hard mask pattern 122 may be formed by patterning the hard mask layer 120 using the imprint resin pattern 132. A wire grid pattern layer 112 may be formed by patterning the first layer 110 using the hard mask pattern 122. The wire grid pattern layer 112 may include a plurality of protrusions formed at substantially uniform intervals and having substantially the same shape.

Here, the hard mask pattern 122 and the wire grid pattern layer 112 may be formed by a separate process or by a continuous one process depending on a material of the hard mask layer 120 and the material of the first layer 110.

Referring to FIGS. 2K and 2I, the base substrate 110 may include an active area AA and a peripheral area PA surrounding the active area AA. The active area AA is disposed in the first area AA', and is smaller than the first area AA'. The active area AA may correspond to an area where the wire grid polarizer is formed in the display apparatus, and the peripheral area PA may correspond to a peripheral area which is a non-display area.

A photoresist pattern 200 may be formed in the active area AA on the base substrate 110 on which the wire grid pattern layer 112 is formed. The photoresist pattern 20 may be formed by substantially the same steps as those described in FIGS. 1K and 1L. Thus, redundant description is omitted.

Referring to FIGS. 2M and 2N, the hard mask pattern 112 and the wire grid pattern 122 in the peripheral area PA may be removed using the photoresist pattern 200. This step is substantially the same as that of FIGS. 1M and 1N. Thus, redundant description is omitted.

Referring to FIGS. 2O and 2P, a capping layer 140 may be formed on the base substrate 110 on which the wire grid pattern 112 is formed. This step is substantially the same as that of FIGS. 1O and 1P. Thus, redundant description is omitted.

According to this exemplary embodiment, the stamp 310 is smaller than the base substrate 100 and, the active area AA is smaller than the stamp 310. Accordingly, even if a pattern defect occurs at the edge during the imprint process, the defected pattern at the edge is located outside the active area AA and is removed, so that quality of the wire grid pattern of the active area in the area where the image is displayed is improved. Consequently, the optical characteristics of the wire grid polarizer may be improved. Accordingly, display quality of the display apparatus may be improved.

Figure 3A:
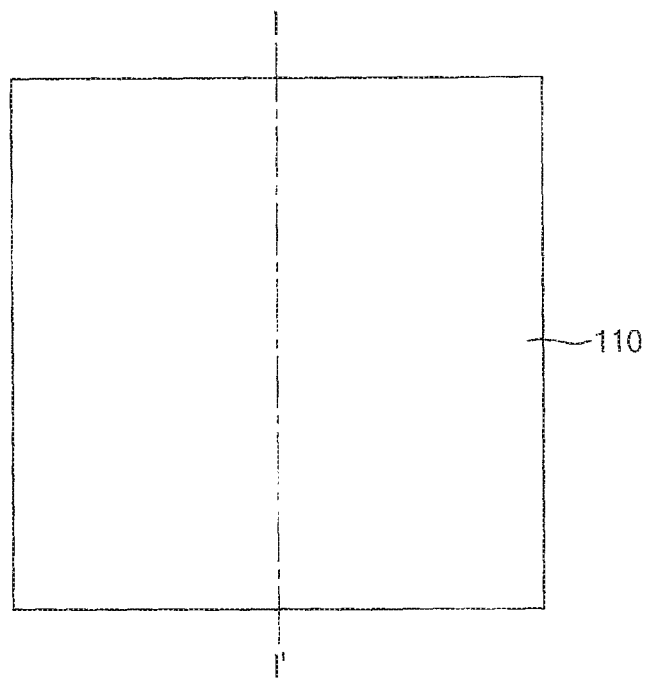
FIGS. 3A to 3R are plan views and cross-sectional views of steps in a third exemplary method of manufacturing a wire grid polarizer for a display apparatus according to the principles of the invention.
Figure 3B:
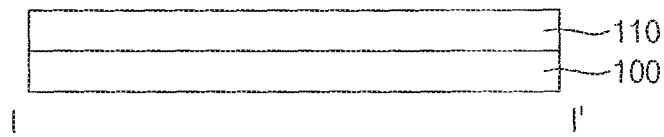
Figure 3C:
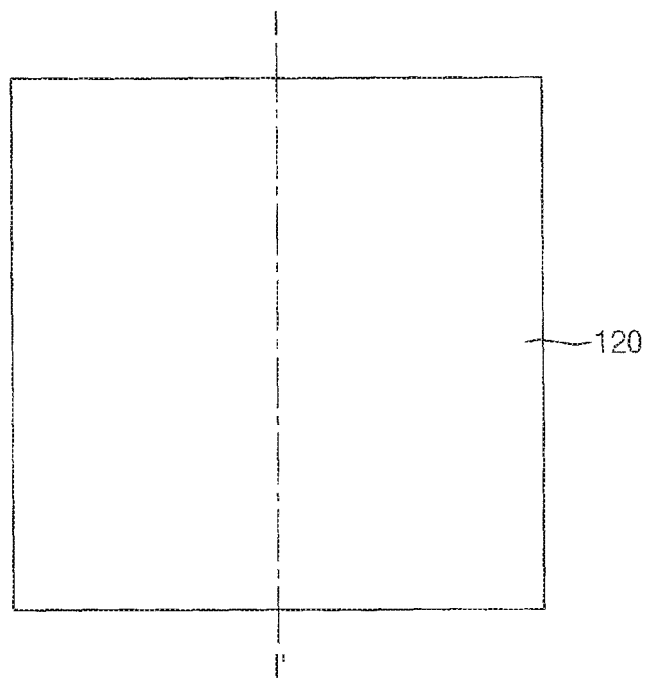
Figure 3D:
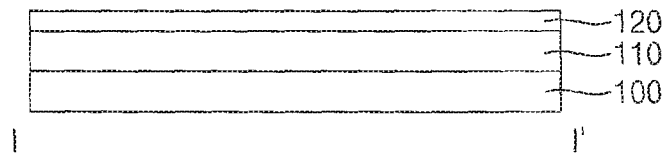
Figure 3E:
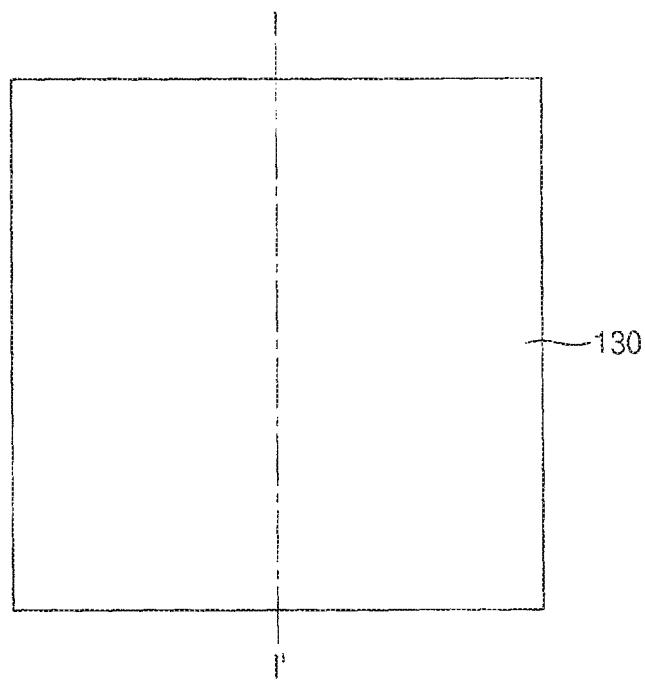
Figure 3F:
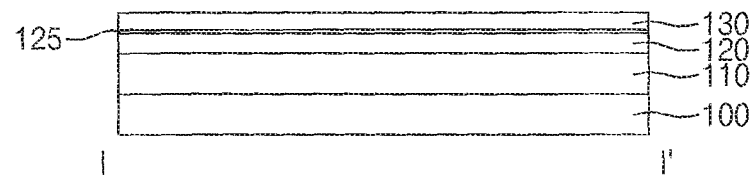
Figure 3G:
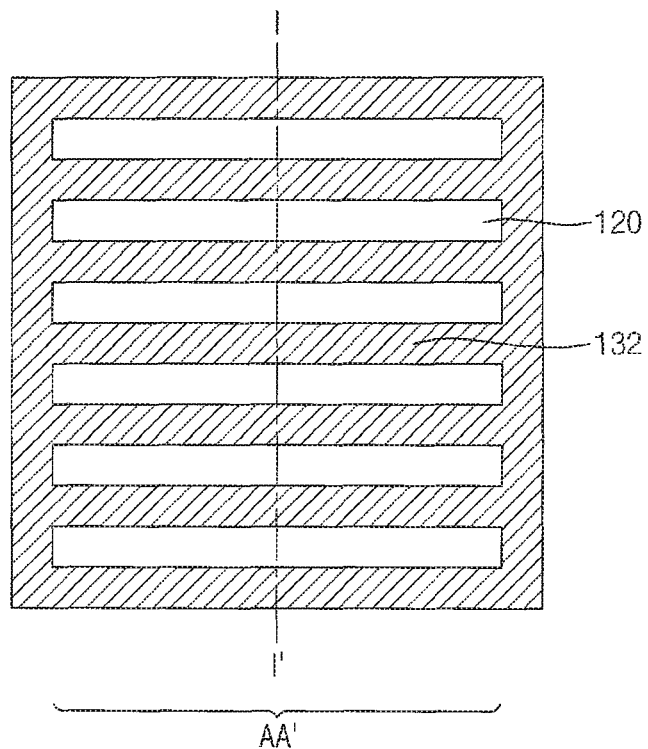
Figure 3H:
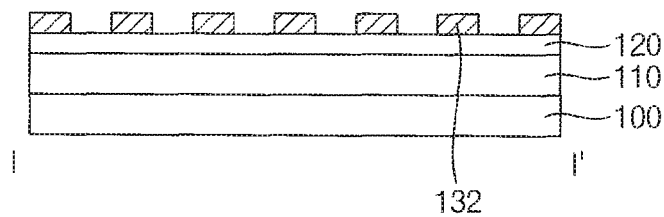
Figure 3I:
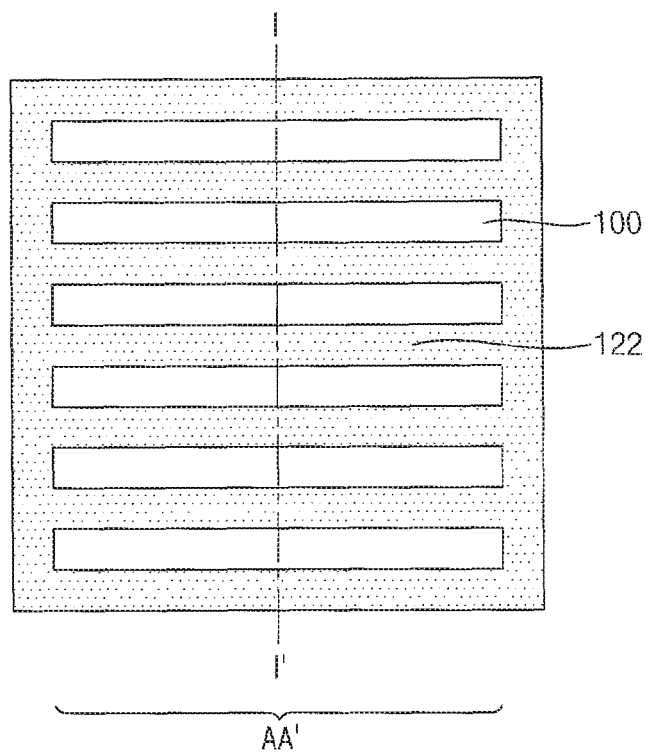
Figure 3J:
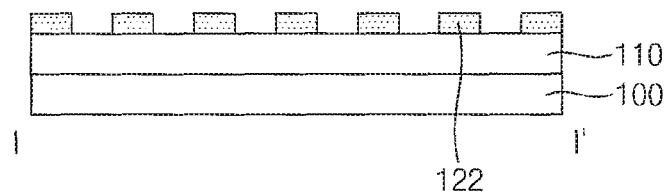
Figure 3K:
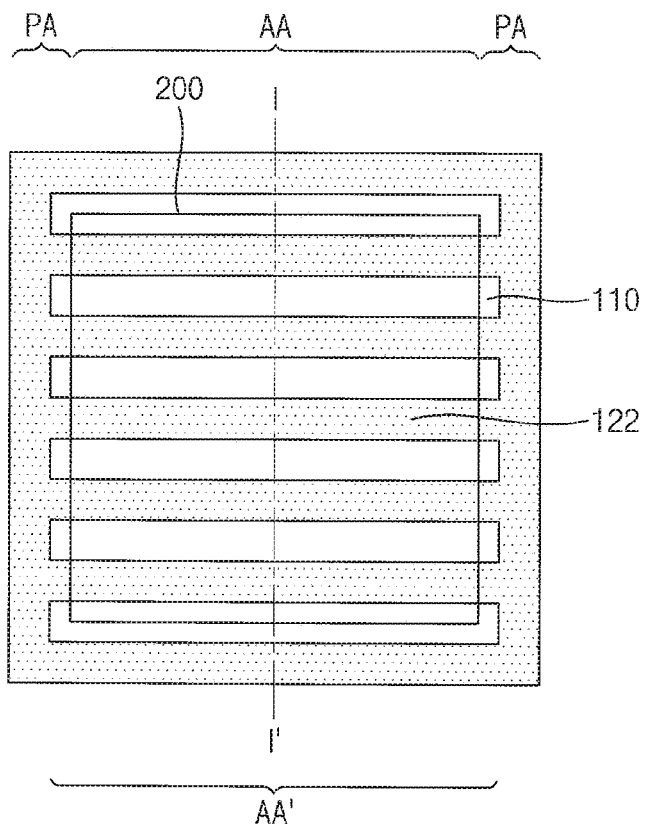
Figure 3L:
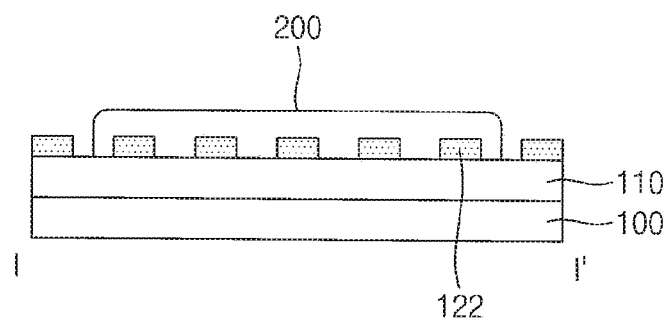
Figure 3M:
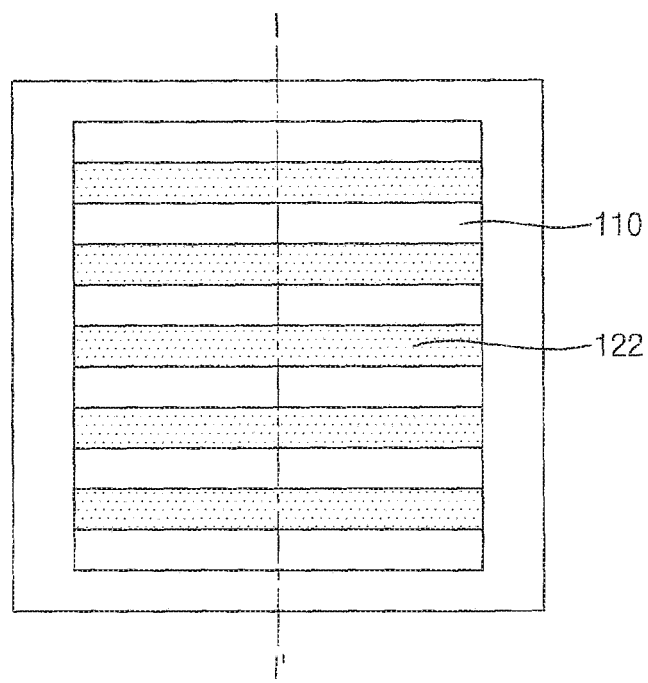
Figure 3N:
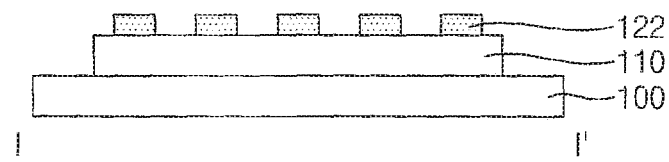
Figure 3O:
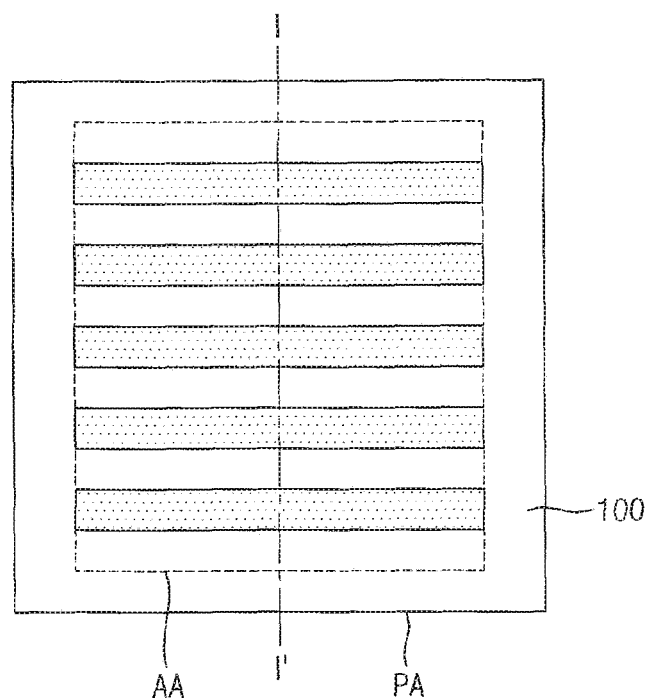
Figure 3P:
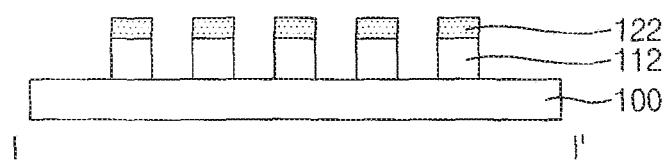
Figure 3Q:
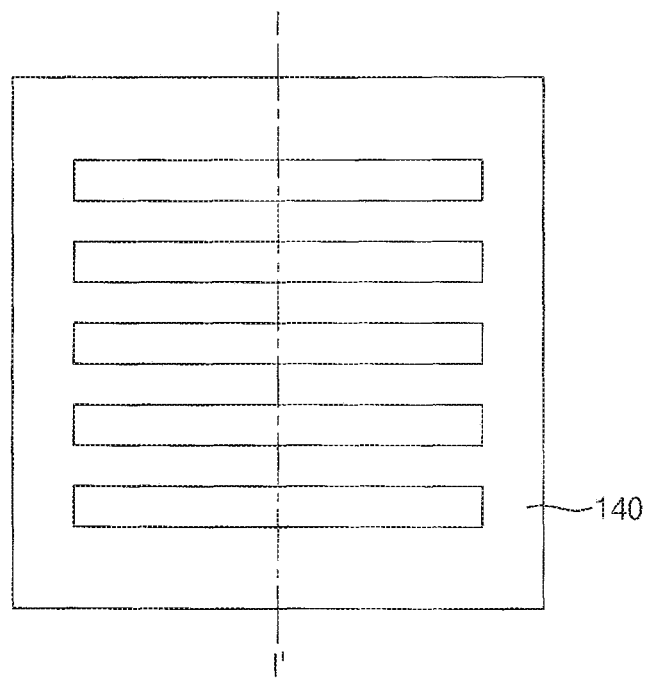
Figure 3R:
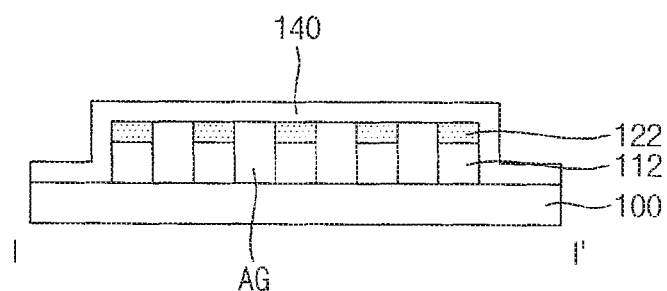

FIGS. 3A to 3R are plan views and cross-sectional views of steps in a third exemplary method of manufacturing a wire grid polarizer for a display apparatus according to the principles of the invention. The method may be substantially same as the method of FIGS. 2A to 2P, except that the wire grid pattern is formed after patterning outer boundary of the first layer. Thus, any further detailed descriptions concerning substantially the same elements will be omitted or just briefly described.

Referring to FIGS. 3A and 3B, a first layer 110 may be formed on a base substrate 100.

Referring to FIGS. 3C and 3D, a hard mask layer 130 may be formed on the first layer 110.

Referring to FIGS. 3E and 3F, an imprint resin 130 may be coated on the hard mask layer 120. Here, before coating the imprint resin 130, an adhesion promoter layer 125 may be further formed on the hard mask layer 120.

Referring to FIGS. 3G and 3H, an imprint resin pattern 132 may be formed on the base substrate 110 in a first area AA'.

Referring to FIGS. 3I and 3J, a hard mask pattern 122 may be formed by patterning the hard mask layer 120 using the imprint resin pattern 132.

Referring to FIGS. 3K and 3I, the base substrate 110 may include an active area AA and a peripheral area PA surrounding the active area AA. The active area AA is disposed in the first area AA', and is smaller than the first area AA'.

A photoresist pattern 200 may be formed in the active area AA on the base substrate 110 on which the wire grid pattern layer 112 is formed.

Referring to FIGS. 3M and 3N, the hard mask pattern 112 and the first layer 110 in the peripheral area PA may be removed using the photoresist pattern 200.

And then, the photoresist pattern 200 may be removed.

Referring to FIGS. 3O and 3P, a wire grid pattern layer 112 may be formed by patterning the first layer 110 using the hard mask pattern 122. The wire grid pattern layer 110 may include a plurality of protrusions formed at substantially uniform intervals and having substantially the same shape.

Referring to FIGS. 3Q and 3R, a capping layer 140 may be formed on the base substrate 110 on which the wire grid pattern 112 is formed.

According to the this embodiment, the photoresist pattern 220 is formed on the first layer 110 after the hard mask pattern 122 is formed, the photoresist pattern 200 can be more easily removed than when the first layer 110 is previously patterned. That is, since there are only small step portions due to not patterning the first layer 110 on which the photoresist pattern 200 disposed, the photoresist pattern 200 can be more easily removed than when the first layer 110 is previously patterned.

Figure 4A:
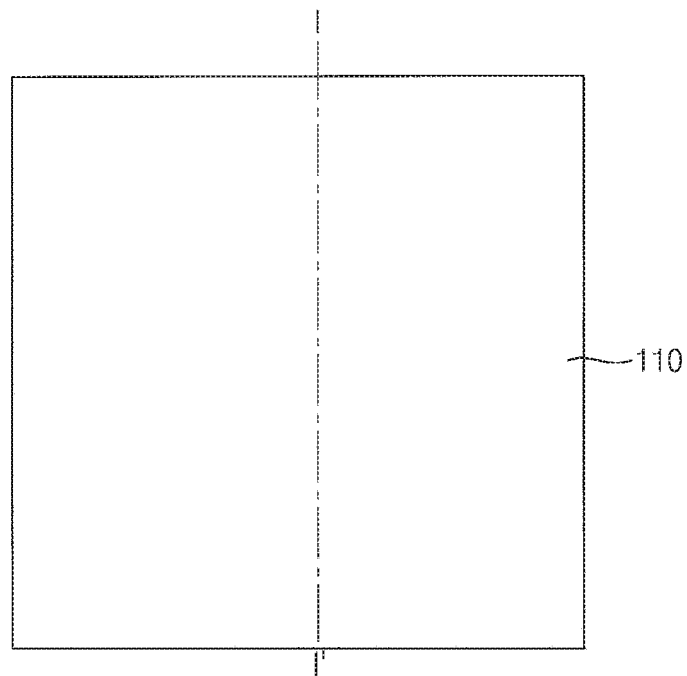
FIGS. 4A to 4V are plan views and cross-sectional views of steps in a fourth exemplary method of manufacturing a wire grid polarizer for a display apparatus according to the principles of the invention.
Figure 4B:
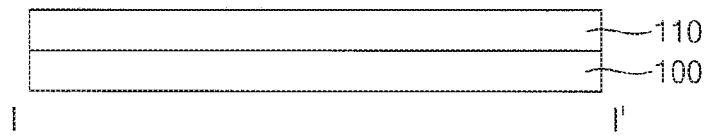
Figure 4C:
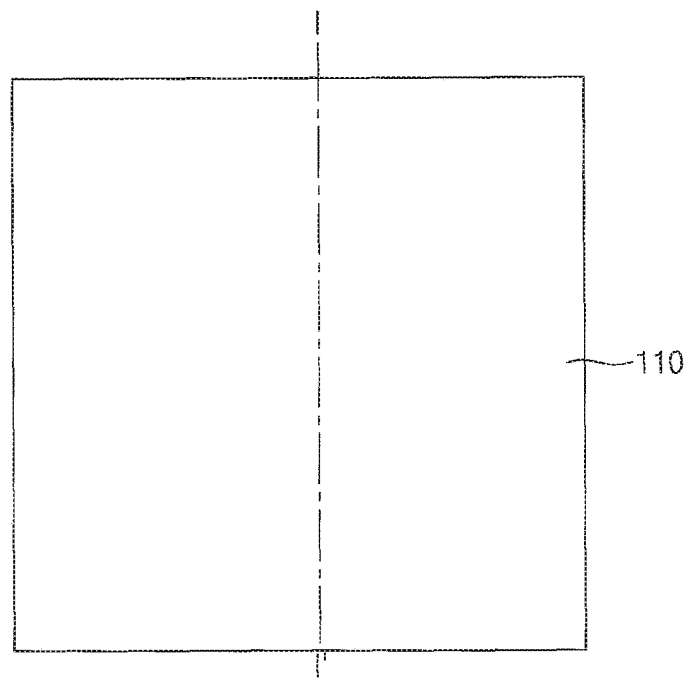
Figure 4D:
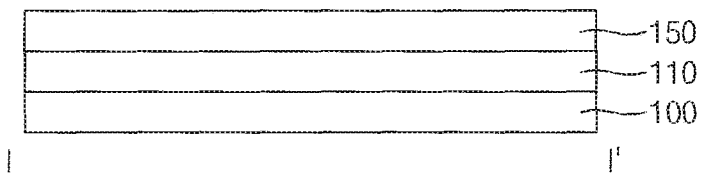
Figure 4E:
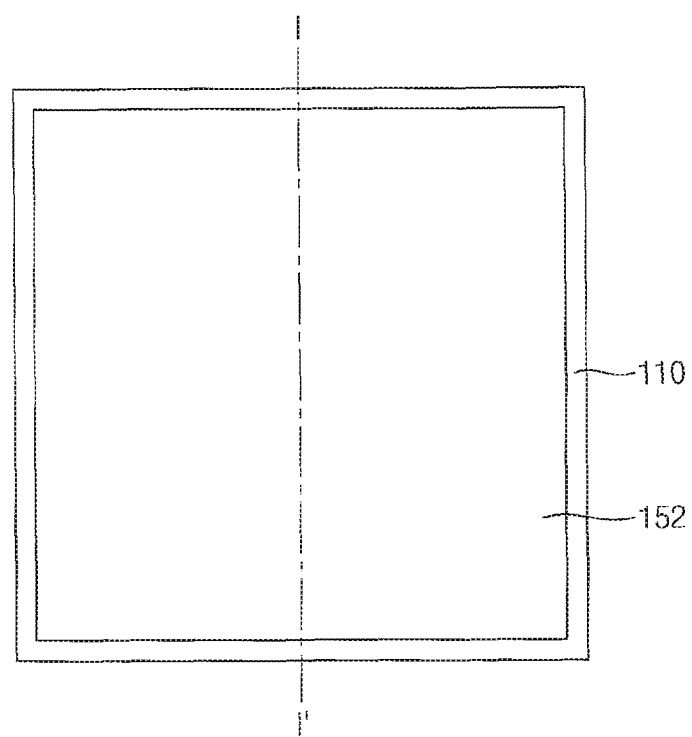
Figure 4F:
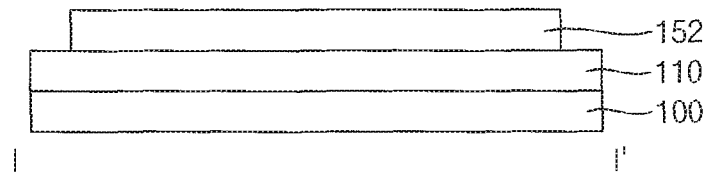
Figure 4G:
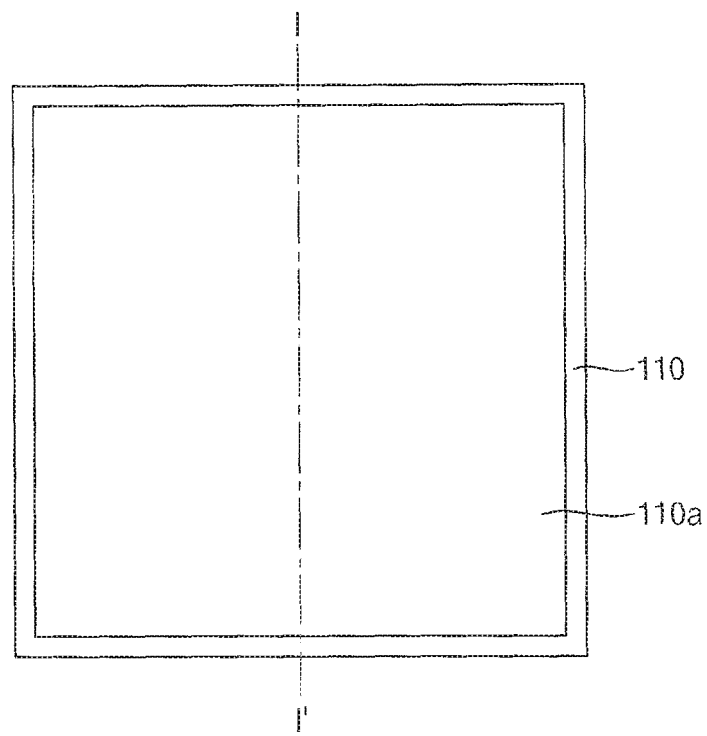
Figure 4H:
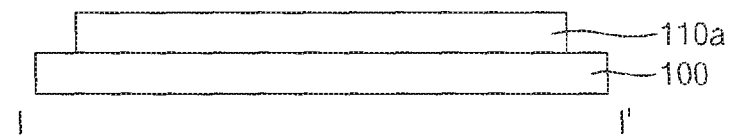
Figure 4I:
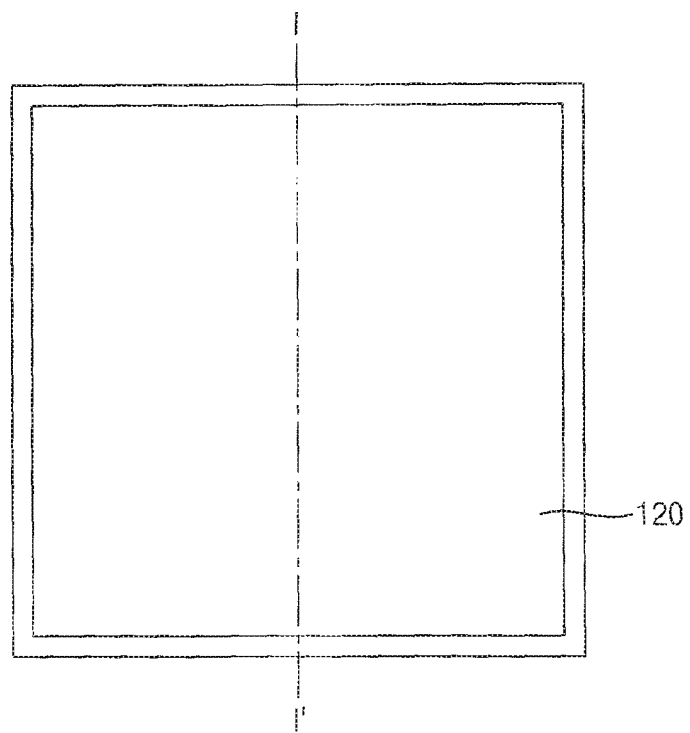
Figure 4J:
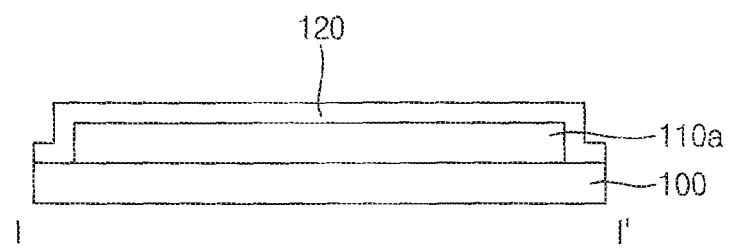
Figure 4K:
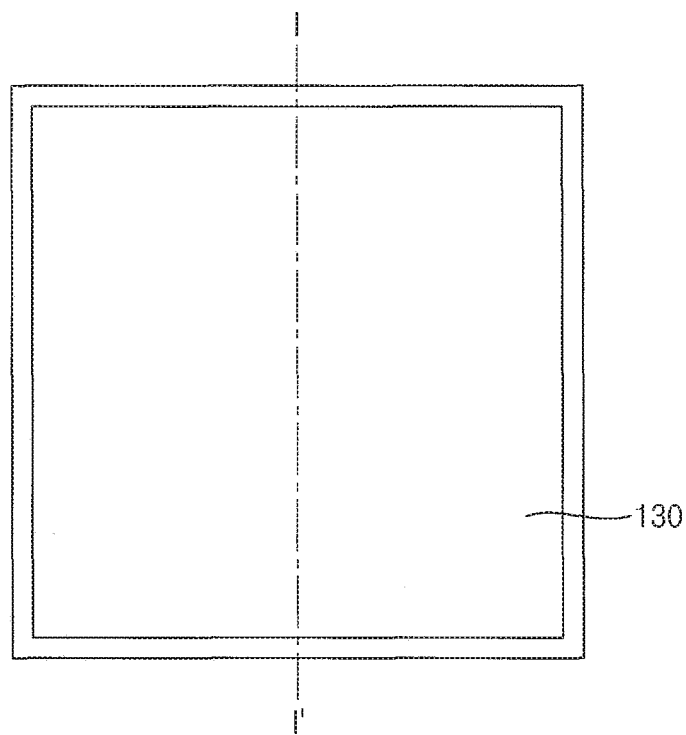
Figure 4L:
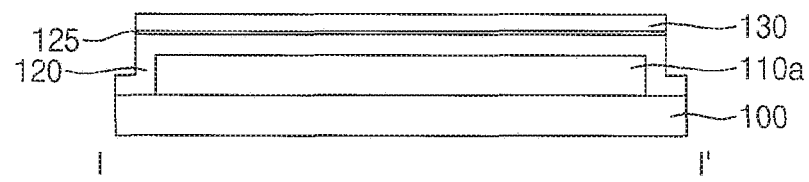
Figure 4M:
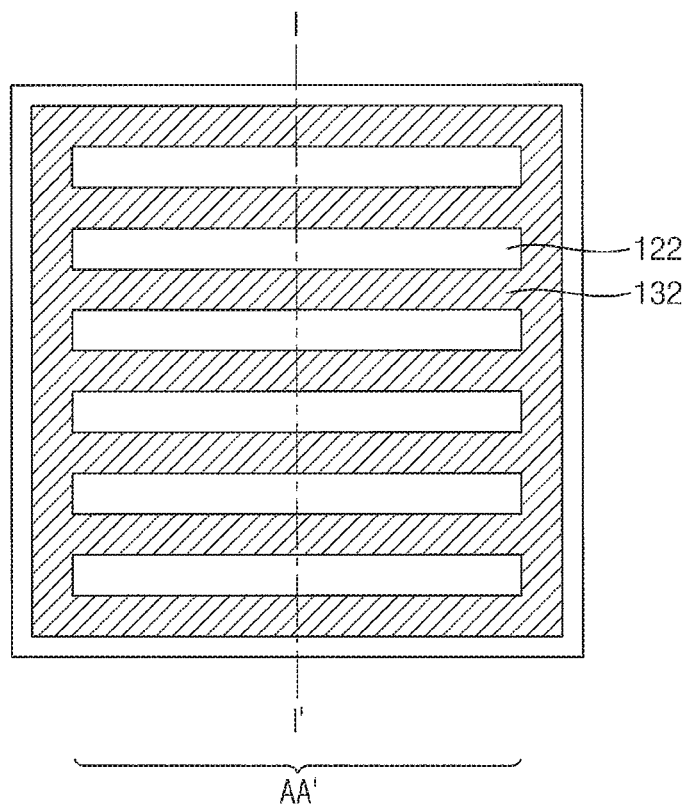
Figure 4N:
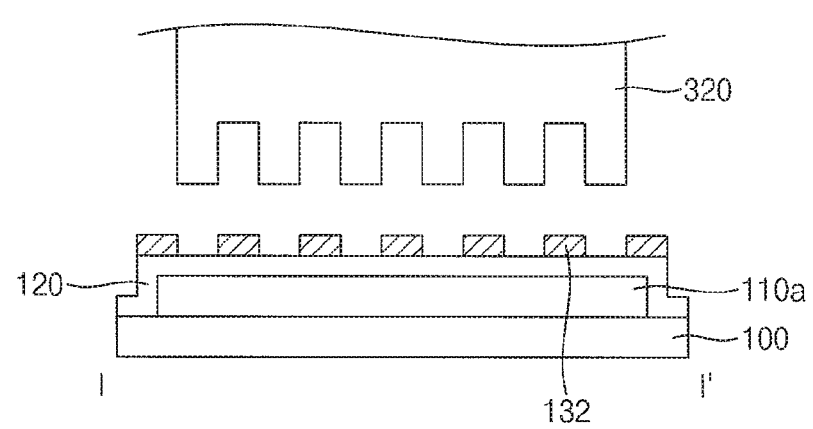
Figure 4O:
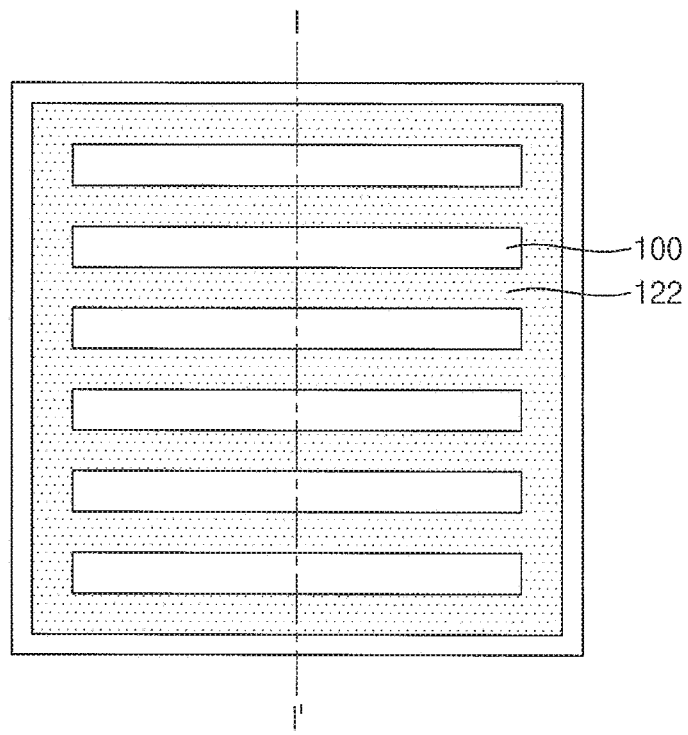
Figure 4P:
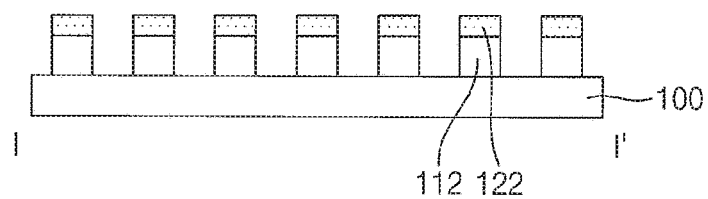
Figure 4Q:
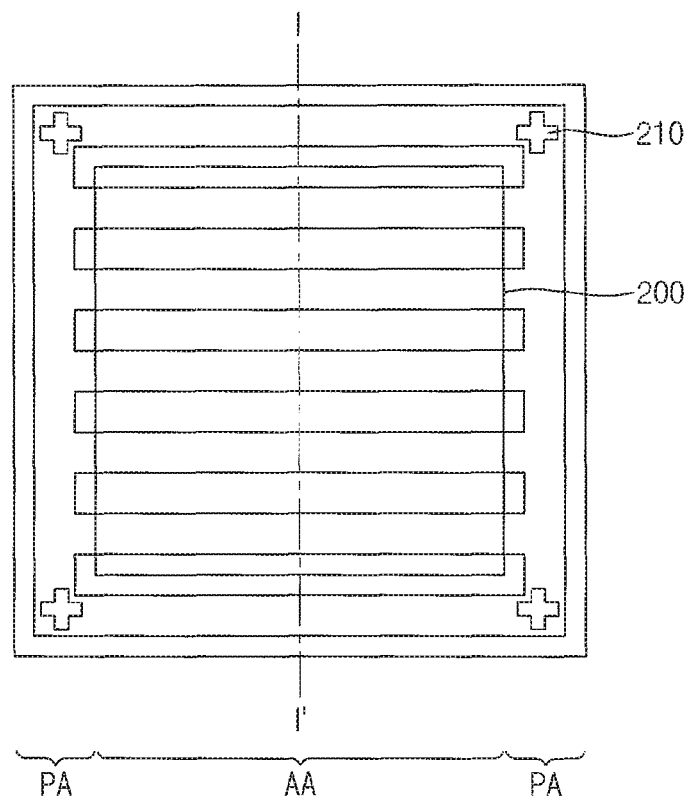
Figure 4R:
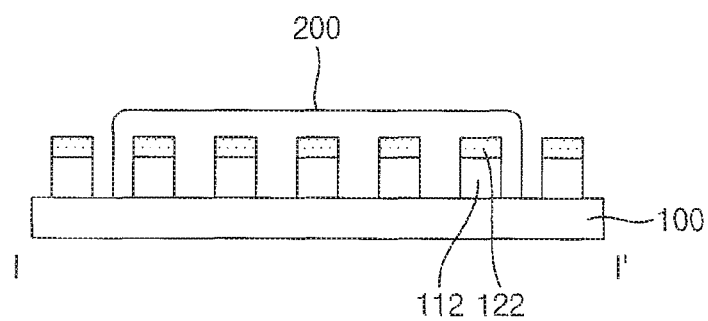
Figure 4S:
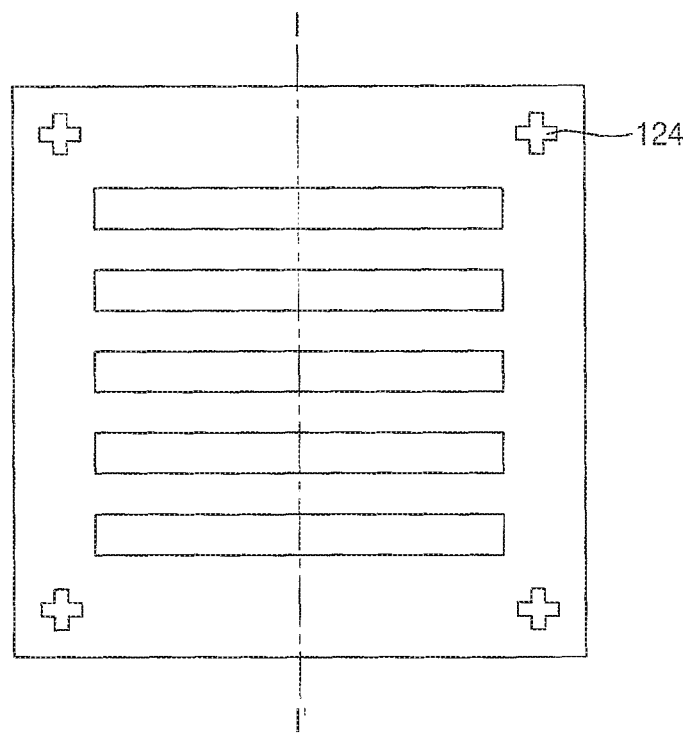
Figure 4T:
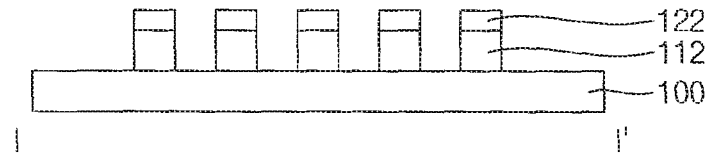
Figure 4U:
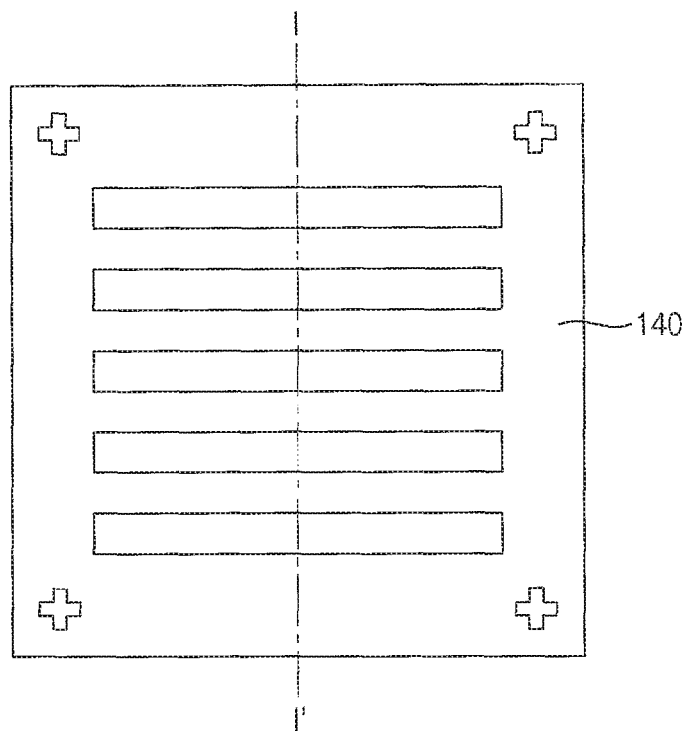
Figure 4V:
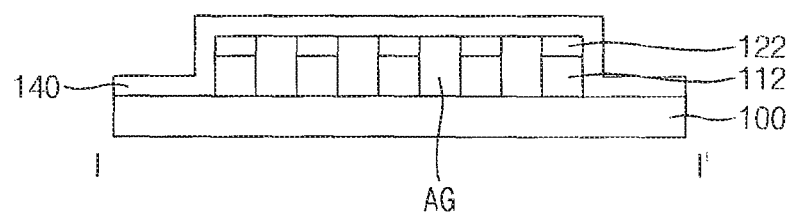

FIGS. 4A to 4V are plan views and cross-sectional views of steps in a fourth exemplary method of manufacturing a wire grid polarizer for a display apparatus according to the principles of the invention. The method may be substantially same as the method of FIGS. 2A to 2P, except that this method further includes the steps of removing outer boundary of the first layer and forming an alignment key. Thus, any further detailed descriptions concerning substantially the same elements will be omitted or briefly described.

Referring to FIGS. 4A and 4B, a first layer 110 may be formed on a base substrate 100.

Referring to FIGS. 4C and 4D, a photoresist layer 150 may be formed on the first layer 110. The photoresist layer 150 may be formed on entire top surface of the first layer 110. The photoresist layer 150 may include positive type photoresist in which the exposed portion is removed by a developing solution.

Referring to FIGS. 4E and 4F, the outer boundary portion of the photoresist layer 150 may be removed. For example, when the photoresist layer 150 includes the positive type photoresist, the outer boundary of the photoresist layer 150 may be exposed and developed to be removed. It can be possible that the photoresist layer 150 is exposed and developed using an additional mask to remove the outer boundary. In addition, the outer boundary portion of the photoresist layer 150 may be removed through an EBR (edge built-up remove) process.

Accordingly, outer boundary portion of the first layer 110 may be exposed.

Referring to FIGS. 4G and 4H, outer boundary portion of the first layer 110 may be removed using the photoresist layer 150 in which the outer boundary portion is removed. Accordingly, the first layer 110*a* may be smaller than the base substrate 100, and the outer boundary portion of the first layer 110 may be exposed.

Referring to FIGS. 4I and 4J, a hard mask layer 120 may be formed on the first layer 110*a*.

Referring to FIGS. 4K and 4L, an imprint resin 130 may be coated on the hard mask layer 120. Here, before coating the imprint resin 130, an adhesion promoter layer 125 may be further formed on the hard mask layer 120.

Referring to FIGS. 4M and 4N, an imprint resin pattern 132 may be formed on the base substrate 110 in a first area AA'. A stamp 320 having a size same as the first area AA' may be imprinted to the imprint resin 130 to form the imprinted resin pattern 132.

Here, the first area AA' is smaller than the first layer in which the outer boundary is removed, there is no stepped portion in an imprint area in which the stamp 320 is imprinted, and the top surface of the imprint resin 130 is substantially flat. The top surface of the imprint resin 130 is flat without any stepped portions, so that the imprint resin pattern 132 may be substantially uniformly formed.

Referring to FIGS. 4O and 4P, a hard mask pattern 122 may be formed by patterning the hard mask layer 120 using the imprint resin pattern 132. A wire grid pattern layer 112 may be formed by patterning the first layer 110 using the hard mask pattern 122.

Referring to FIGS. 4Q and 4R, the base substrate 100 may include an active area AA and a peripheral area PA surrounding the active area AA. The active area AA may be disposed in the first area AA', and smaller than the first area AA'.

A photoresist pattern 200 may be formed in the active area AA on the base substrate 100 on which the wire grid pattern layer 112 is formed. Here, a pattern 210 for forming an alignment key may be formed in the peripheral area PA on the hard mask layer 120.

Referring to FIGS. 4S and 4T, the hard mask pattern 112 and the wire grid pattern 122 in the peripheral area PA may be removed using the photoresist pattern 200. Here, the alignment key 124 comprises first layer 110 and the hard mask layer 120 may be formed using the pattern 210 in the peripheral area at the same time.

The alignment key 124 may be used for aligning a mask with the base substrate 100 in a subsequent process.

Referring to FIGS. 4U and 4V, a capping layer 140 may be formed on the base substrate 110 on which the wire grid pattern 112 is formed.

According to the this embodiment, since subsequent processes are performed in a state where the outer boundary portion of the first layer 110 is removed, an arc discharge problem caused by a metal material at the outer boundary portion of the base substrate 100 can be reduced.

In addition, it is possible to simultaneously form the alignment key 124 for alignment of the substrates in the process of forming the wire grid pattern layer 112.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A method of manufacturing a wire gird polarizer for a display apparatus, the method comprising the steps of:
   forming a first layer on a base substrate including an active area and a peripheral area surrounding the active area;
   forming a hard mask layer on the first layer;
   coating an imprint resin on the hard mask layer;
   forming an imprint resin pattern by imprinting a stamp on the imprint resin, wherein the stamp is larger than the base substrate;
   forming a hard mask pattern by patterning the hard mask layer using the imprint resin pattern;
   forming a wire grid pattern layer by pattering the first layer using the hard mask pattern, wherein the wire grid pattern layer includes a plurality of protrusions in the active area and in the peripheral area;
   forming a photoresist pattern in the active area on the base substrate, wherein the photoresist pattern does not overlap the hard mask pattern and the wire grid pattern layer in the peripheral area;
   removing the hard mask pattern and the wire grid pattern layer in the peripheral area using the photoresist pattern as an etch barrier; and
   forming a capping layer on the wire grid pattern.

2. The method of claim 1, wherein the step of coating the imprint resin comprises:
   forming an adhesion promoter layer on the hard mask layer over both the active area and the peripheral area; and
   coating the imprint resin on the adhesion promoter layer over both the active area and the peripheral area.

3. The method of claim 1, further comprising:
   forming a photoresist layer on the first layer before forming the hard mask layer;
   removing an outer boundary portion of the photoresist layer; and
   removing an outer boundary portion of the first layer using the photoresist layer in which the outer boundary portion is removed.

4. The method of claim 1, wherein the step of forming the first layer comprises forming the first layer from at least one of the aluminum (Al), titanium (Ti), gold (Au), chromium (Cr), silver (Ag), copper (Cu), nickel (Ni), iron (Fe) and cobalt (Co), and
   the step of forming the hard mask layer comprises forming the hard mask layer from a silicon compound.

5. The method of claim 1, wherein the step of forming the wire grid pattern layer comprises forming a plurality of protrusions having substantially the same shape at substantially uniform intervals at a pitch of about 50 nm to 150 nm.

6. The method of claim 1, wherein step of forming the capping layer on the wire grid pattern comprises forming air gaps between the protrusions of the wire grid pattern.

7. A method of manufacturing a wire gird polarizer for the display apparatus, the method comprising the steps of:
   forming a first layer on a base substrate including an active area and a peripheral area surrounding the active area;
   forming a hard mask layer on the first layer;
   coating an imprint resin on the hard mask layer;
   forming an imprint resin pattern in a first area by imprinting a stamp on the imprint resin, wherein the stamp is smaller than the base substrate, wherein the first area is bigger than the active area;
   forming a hard mask pattern by patterning the hard mask layer using the imprint resin pattern;
   forming a wire grid pattern layer by pattering the first layer using the hard mask pattern, wherein the wire grid pattern layer includes a plurality of protrusions in the active area and in the peripheral area;
   forming a photoresist pattern in the active area on the base substrate on which the wire grid pattern is formed, wherein the photoresist pattern does not overlap the hard mask pattern and the wire grid pattern layer in the peripheral area;
   removing the hard mask pattern and the wire grid pattern layer in the peripheral area using the photoresist pattern as an etch barrier; and
   forming a capping layer on the wire grid pattern.

8. The method of claim 7, wherein the step of coating the imprint resin comprises:

forming an adhesion promoter layer on the hard mask layer over both the active area and the peripheral area; and coating the imprint resin on the adhesion promoter layer over both the active area and the peripheral area.

9. The method of claim 7, further comprising:
forming a photoresist layer on the first layer before forming the hard mask layer;
removing outer boundary portion of the photoresist layer; and
removing outer boundary portion of the first layer using the photoresist layer in which the outer boundary portion is removed.

10. The method of claim 7, wherein the step of forming the first layer comprises forming the first layer from at least one of the aluminum (Al), titanium (Ti), gold (Au), chromium (Cr), silver (Ag), copper (Cu), nickel (Ni), iron (Fe) and cobalt (Co), and
the step of forming the hard mask layer comprises forming the hard mask layer from a silicon compound.

11. The method of claim 7, wherein the step of forming the wire grid pattern layer comprises forming a plurality of protrusions having substantially the same shape at substantially uniform intervals at a pitch of about 50 nm to 150 nm.

12. A method of manufacturing a wire gird polarizer for a display apparatus, the method comprising the steps of:
forming a first layer on a base substrate including an active area and a peripheral area surrounding the active area;
forming a hard mask layer on the first layer;
coating an imprint resin on the hard mask layer;
forming an imprint resin pattern in a first area by imprinting a stamp on the imprint resin, wherein the stamp is smaller than the base substrate, wherein the first area is bigger than the active area;
forming a hard mask pattern by patterning the hard mask layer using the imprint resin pattern;
forming a first photoresist pattern in an active area on the base substrate on which the hard mask pattern is formed, wherein the photoresist pattern does not overlap the hard mask pattern and the first layer in the peripheral area;
removing the hard mask pattern and the first layer in the peripheral area using the first photoresist pattern as an etch barrier; and
forming a wire grid pattern layer by patterning the first layer using the hard mask pattern; and
forming a capping layer on the wire grid pattern.

13. The method of claim 12, wherein the step of coating the imprint resin comprises:

forming an adhesion promoter layer on the hard mask layer over both the active area and the peripheral area; and coating the imprint resin on the adhesion promoter layer over both the active area and the peripheral area.

14. The method of claim 12, further comprising:
forming a second photoresist layer on the first layer before forming the hard mask layer;
removing an outer boundary portion of the second photoresist layer; and
removing an outer boundary portion of the first layer using the second photoresist layer in which the outer boundary portion is removed.

15. The method of claim 14, wherein the step of forming the second photoresist layer comprises forming a positive type photoresist layer, and
wherein in the step of removing the outer boundary portion of the second photoresist layer, the outer boundary portion of the second photoresist layer is exposed and developed to be removed without an additional mask, or the outer boundary portion is exposed and developed using an additional mask to be removed.

16. The method of claim 12, wherein in the step of forming the first photoresist pattern, a pattern for forming an alignment key is formed in the peripheral area,
and wherein in the step of removing the hard mask pattern and the first layer in the peripheral area, the alignment key is formed by patterning of the first layer and the hard mask pattern in the peripheral area.

17. The method of claim 12, wherein in the step of coating the imprint resin, a substantially flat top surface of the hard mask layer in which there is no stepped portion is larger than the first area.

18. The method of claim 12, wherein the step of forming the first layer comprises forming the first layer from at least one of the aluminum (Al), titanium (Ti), gold (Au), chromium (Cr), silver (Ag), copper (Cu), nickel (Ni), iron (Fe) and cobalt (Co), and
the step of forming the hard mask layer comprises forming the hard mask layer from a silicon compound.

19. The method of claim 18, wherein the step of forming the wire grid pattern layer comprises forming a plurality of protrusions having substantially the same shape at substantially uniform intervals at a pitch of about 50 nm to 150 nm.

20. The method of claim 12, wherein the active area is larger than a display area configured to display an image.

* * * * *